United States Patent
Hino et al.

(10) Patent No.: US 10,082,618 B2
(45) Date of Patent: Sep. 25, 2018

(54) IMAGE DISPLAY MODULE WITH SUPERIOR WHITE POINT STABILITY

(71) Applicants: DAI NIPPON PRINTING CO., LTD., Shinjuku-ku, Tokyo (JP); NICHIA CORPORATION, Anan-shi, Tokushima (JP)

(72) Inventors: Kazuyuki Hino, Tokyo (JP); Seiji Tawaraya, Tokyo (JP); Hiroto Itoi, Anan (JP); Atsushi Yamamoto, Komatsushima (JP); Takeshi Morikawa, Tokushima (JP)

(73) Assignees: DAI NIPPON PRINTING CO., LTD., Tokyo (JP); NICHIA CORPORATION, Anan-shi (JP)

( * ) Notice: Subject to any disclaimer, the term of this patent is extended or adjusted under 35 U.S.C. 154(b) by 150 days.

(21) Appl. No.: 14/881,547

(22) Filed: Oct. 13, 2015

(65) Prior Publication Data

US 2016/0104821 A1    Apr. 14, 2016

(30) Foreign Application Priority Data

Oct. 14, 2014   (JP) ................................. 2014-210304

(51) Int. Cl.
G02F 1/1335     (2006.01)
F21V 8/00       (2006.01)

(52) U.S. Cl.
CPC ..... *G02B 6/0073* (2013.01); *G02F 1/133514* (2013.01); *G02F 1/133603* (2013.01); *G02B 6/0068* (2013.01); *G02F 2001/133614* (2013.01)

(58) Field of Classification Search
CPC ............... G02B 6/0073; G02B 6/0068; G02F 1/133514; G02F 1/133603; G02F 2001/133614
See application file for complete search history.

(56) References Cited

U.S. PATENT DOCUMENTS 8,198,805 B2 * 6/2012 Takagi ................ H01L 27/3246
                                                                    313/110
9,213,199 B2 * 12/2015 Hino ................. G02F 1/133514
(Continued)

FOREIGN PATENT DOCUMENTS

JP     H10-090681 A     4/1998
JP     H11-340516 A     12/1999
(Continued)

OTHER PUBLICATIONS

Arai et al., Japanese Patent Application Publication 2003-233062, machine translation.*
(Continued)

*Primary Examiner* — Tracie Y Green
(74) *Attorney, Agent, or Firm* — Hunton Andrews Kurth LLP

(57) ABSTRACT

An image display module includes a light emitting device including a nitride semiconductor light-emitting element, as a light source, having an emission peak wavelength in a wavelength range of 240 nm to 560 nm, an $Mn^{4+}$-activated red fluorescent material having a maximum excitation wavelength in the wavelength range, an emission peak wavelength of 610 nm to 670 nm, and a half bandwidth of the emission spectrum of 30 nm or less, and a green fluorescent material having an emission peak wavelength in a wavelength range of 510 nm to 550 nm; and a color filter having a blue pixel wherein the difference between the maximum and the minimum value of transmittance at a wavelength range of 420 nm to 460 nm of the spectral transmittance curve is 4% or less.

19 Claims, 3 Drawing Sheets

(56) References Cited

U.S. PATENT DOCUMENTS

| | | | |
|---|---|---|---|
| 2008/0212305 A1* | 9/2008 | Kawana | C09B 67/0033 362/84 |
| 2010/0014799 A1 | 1/2010 | Bulovic et al. | |
| 2010/0091215 A1 | 4/2010 | Fukunaga et al. | |
| 2010/0142189 A1* | 6/2010 | Hong | C09K 11/616 362/97.3 |
| 2011/0025954 A1* | 2/2011 | Akao | G02F 1/133555 349/75 |
| 2011/0309399 A1 | 12/2011 | Shinohara et al. | |
| 2014/0009955 A1 | 1/2014 | Bulovic et al. | |
| 2015/0077685 A1 | 3/2015 | Okada et al. | |

FOREIGN PATENT DOCUMENTS

| | | |
|---|---|---|
| JP | 2003-233062 A | 8/2003 |
| JP | 2003-315778 A | 11/2003 |
| JP | 2009-212508 A | 9/2009 |
| JP | 2009-251563 A | 10/2009 |
| JP | 2009-538001 A | 10/2009 |
| JP | 2010093132 A | 4/2010 |
| JP | 2010-128310 A | 6/2010 |
| JP | 2010-209311 A | 9/2010 |
| JP | 2012-141368 A | 7/2012 |
| JP | 2013-014715 A | 1/2013 |
| JP | 2013-060506 A | 4/2013 |
| JP | 2013-080044 A | 5/2013 |
| JP | 2013-242522 A | 12/2013 |
| WO | 2010/098141 A1 | 2/2010 |
| WO | 2012/023611 A1 | 2/2012 |

OTHER PUBLICATIONS

Sako et al., Japanese Patent Application Publication JP2009-212508, machine translation.*

Sonehara, Japanese Patent Application 10090681, Apr. 1998.*

Taguchi et al, Japanese Patent Application Publication 2003-315778, machine translation.*

International Search Report dated Dec. 22, 2015 in International Patent Application No. PCT/JP2015/078961 and English translation.

* cited by examiner ic patent Application No. 2014-210304, filed on Oct. 14, 2014, the entire contents of which are incorporated by reference herein.

IMAGE DISPLAY MODULE WITH SUPERIOR WHITE POINT STABILITY

CROSS-REFERENCE TO RELATED APPLICATIONS

This application claims priority under 35 USC 119 from Japanese patent Application No. 2014-210304, filed on Oct. 14, 2014, the entire contents of which are incorporated by reference herein.

BACKGROUND OF THE INVENTION

Field of the Invention

The present invention relates to a module for an image display device (hereinafter "an image display module") and an image display device including the module.

Description of the Related Art

Liquid crystal display devices are rapidly and widely used in many applications, and competition to achieve higher image quality with lower manufacturing cost is increasingly becoming fierce. In all liquid crystal display devices, characteristics such as high contrast, high-speed response, color reproducibility, high luminosity, and high color purity are required.

Cold-cathode fluorescent lamps, a conventional backlight source, have been increasingly replaced by LED backlight sources, mainly because LED backlight sources have longer service life, higher brightness, and are mercury-free. An LED backlight is used as a white light source containing blue light from LED and a yellow YAG (Yttrium Aluminum Garnet) fluorescent material that is excited using the blue light.

In connection with the above, color filters are described that contain pigments having a transmittance at a wavelength of 600 nm to 660 nm of 50% and that reproduce a wide range colors while increasing white brightness when used in combination with a white light-emitting diode light source (see, for example, Japanese Patent Application Laid-Open No. 2010-128310). In addition, color filters including blue pixels that have an average light transmittance at wavelengths of 420 nm to 460 nm of 80% or more used for a white-light-emitting diode light source that has a maximum emission spectrum at wavelengths of 430 to 450 nm with fluctuations (a) in the maximum value wavelength of 3 or more, are described, and such color filters are said to be capable of reducing color shift in images to be displayed (see, for example, Japanese Patent Application Laid-Open No. 2013-080044).

SUMMARY OF THE INVENTION

An image display module includes a light emitting device and a color filter. The light emitting device includes a nitride semiconductor light-emitting element, as a light source, having an emission peak wavelength in a wavelength range of 240 nm to 560 nm, an $Mn^{4+}$-activated red fluorescent material having a maximum excitation wavelength in the wavelength range, an emission peak wavelength of 610 nm to 670 nm, and a half bandwidth of the emission spectrum of 30 nm or less, and a green fluorescent material having an emission peak wavelength in a wavelength range of 510 nm to 550 nm. The color filter has a blue pixel wherein the difference between the maximum and the minimum value of transmittance at a wavelength range of 420 nm to 460 nm of the spectral transmittance curve is 4% or less.

DETAILED DESCRIPTION OF THE INVENTION

Figure 1:
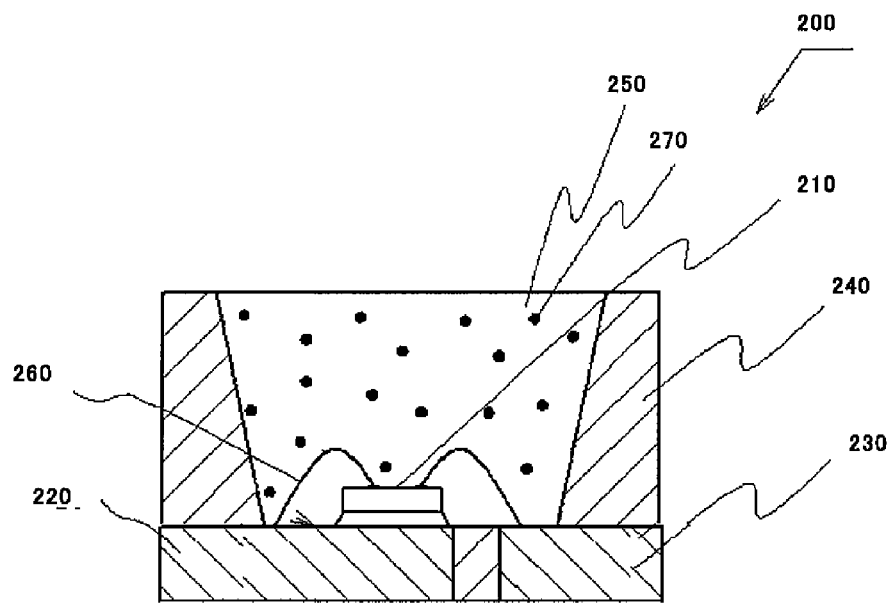
FIG. 1 is a schematic sectional view showing an example of a light emitting device according to the present embodiment.

The combination of a white-light-emitting device and a color filter, however, is not always reliable in terms of stable display of white point. The present invention provides an image display module that includes a light emitting device and a color filter, and is capable of forming an image display device superior in stable display of white point, and an image display device including the module.

Specific means for solving the above-described problem is as follows, which includes the following embodiments. The first embodiment of the present invention is an image display module including a light emitting device that includes a nitride semiconductor light-emitting element, as a light source, having an emission peak wavelength in the range of 240 nm to 560 nm; an $Mn^{4+}$-activated red fluorescent material having a maximum excitation wavelength in the above-described wavelength range, an emission peak wavelength in the range of 610 nm to 670 nm, and a half bandwidth of the emission spectrum of 30 nm or less; and a green fluorescent material having an emission peak wavelength in the range of 510 nm to 550 nm; and a color filter including blue pixels in which the difference between the maximum and the minimum values of transmittance in the wavelength range of 420 nm to 460 nm of the spectral transmittance curve is 4% or less.

The second embodiment of the present invention is an image display device that includes the image display module.

The embodiment of the present invention enables to provide an image display module that includes a light emitting device and a color filter and that is superior in stable display of white point, and the second embodiment of the present invention enables to provide an image display device that includes the image display module.

Hereinafter, an embodiment according to the present invention will be described in detail. However, the embodiment shown below is an example of an image display module and an image display device for embodying the technical concept of the present invention, and the present invention is by no means limited to the image display module and the image display device described below.

The relationships between the color names and the chromaticity coordinates, the relationships between the wavelength ranges of light and the color names of monochromatic light, and others are in accordance with JIS Z8110. Specifically, 380 nm to 455 nm: bluish-purple, 455 nm to 485 nm:

blue, 485 nm to 495 nm: blue-green, 495 nm to 548 nm: green, 548 nm to 573 nm: yellow-green, 573 nm to 584 nm: yellow, 584 nm to 610 nm: yellow-red, and 610 nm to 780 nm: red.

In the present specification, the term "step" means not only an independent step but also a step which cannot be clearly distinguished from the other steps but that can achieve the desired object. Ranges of numerical values include the numerical values that appear before and after "to" or "-" as the minimum and the maximum values of the range. Furthermore, for the amount of each component contained in the composition, when a plurality of compounds corresponding to the component exists, the amount of the component indicates the total amount of the compounds present in the composition unless otherwise specified.

<Image Display Module>

The image display module according to the present embodiment includes a light emitting device that includes a nitride semiconductor light-emitting element, as a light source, having an emission peak wavelength in the wavelength range of 240 nm to 560 nm and preferably 430 nm to 470 nm; an $Mn^{4+}$-activated red fluorescent material having a maximum excitation wavelength in the above-described wavelength range, an emission peak wavelength of 610 nm to 670 nm, and a half bandwidth of the emission spectrum of 30 nm or less; and a green fluorescent material having an emission peak wavelength in the wavelength range of 510 nm to 550 nm; and a color filter having a blue pixel in which the difference between the maximum and the minimum values of the transmittance in the wavelength range of 420 nm to 460 nm of the spectral transmittance curve is 4% or less.

Using a light emitting device that contains an $Mn^{4+}$-activated red fluorescent material having specific fluorescent properties in combination with a color filter including blue pixels in which the difference between the maximum and the minimum values of the transmittance in the wavelength range of 420 nm to 460 nm of the spectral transmittance curve is 4% or less to form an image display device, stabilizes the chromaticity coordinates of the white point to be displayed. This combination also achieves both high white brightness and high color purity.

In the image display module, the light emitted from the light emitting device that passes through the blue pixels of the color filter preferably has an integral over a wavelength range of 650 nm and above of 0.1 or less to achieve higher stability of the white point.

The spectrum of the light that is emitted from the light emitting device and passes through the blue pixels is measured by a spectrophotometer.

In the image display module, for the light that is emitted from the light emitting device and passes through the color filter, when the emission peak wavelength of the light source in the light emitting device varies in the range of 440 nm to 455 nm, the amounts of change, $\Delta x$ and $\Delta y$, in the white point within the region surrounded by the four points with the coordinates (x, y): (0.2400, 0.2000), (0.2400, 0.3000), (0.3000, 0.3000), and (0.3000, 0.2000) (hereinafter also referred to as "specific chromaticity region") in the CIE1931 chromaticity diagram, are both preferably 0.001 or less.

Color Filter

The color filter includes blue pixels in which the difference between the maximum value and the minimum value of the transmittance in the wavelength range of 420 nm to 460 nm in spectral transmittance curve is 4% or less. The blue pixels preferably have an average transmittance of 80% or more in the wavelength range of 400 nm to 500 nm, and a transmittance of 50% or more in the wavelength range of 720 nm to 780 nm of the spectral transmittance curve. The color filter preferably has a green pixel and a red pixel in addition to blue pixels.

To stabilize the white point displayed in an image display including the image display module, the difference in transmittance of the blue pixel between the maximum value and the minimum value in the wavelength range of 420 nm to 460 nm is 4% or less and preferably 3.5% or less. The blue pixels also preferably have a difference in transmittance of 2% or less between the maximum value and the minimum value in the wavelength range of 440 nm to 455 nm.

Transmittance indicates the intensity of the transmitted light in proportion to that of the incident light. The average transmittance over a predetermined wavelength range is calculated by dividing the integral over the predetermined wavelength range of the spectral transmittance curve obtained using a spectrophotometer by the integral width.

To achieve higher white brightness, the blue pixel preferably has an average transmittance of 80% or more in the wavelength range of 400 DM to 500 nm, and more preferably has an average transmittance of 80% or more, still more preferably 85% or more, and particularly preferably 89% or more in the wavelength range of 420 nm to 460 nm of the spectral transmittance curve.

The blue pixel preferably has a transmittance of 50% or more in the wavelength range of 720 nm to 780 nm of the spectral transmittance curve.

The spectral transmittance curve of the green pixel in the color filter is not particularly limited as long as it has a transmittance in the green region. To achieve higher white brightness, the green pixel preferably has an average transmittance of 50% or more, and more preferably, 60% or more in the wavelength range of 480 nm to 580 nm of the spectral transmittance curve.

To achieve higher white brightness, the green pixel also preferably has a transmittance of 15% or more in the wavelength range of 680 nm to 780 nm, and more preferably, a transmittance of 15% or more in the wavelength range of 680 nm to 760 nm of the spectral transmittance curve.

The spectral transmittance curve of the red pixel in the color filter is not particularly limited as long as it has a transmittance in the red region. To achieve higher white brightness, the red pixel has an average transmittance of preferably 60% or more, and more preferably 70% or more in the wavelength range of 560 nm to 780 nm of the spectral transmittance curve.

Method for Manufacturing the Color Filter

The color filter according to the present embodiment can be produced by forming colored pixels that exhibit desired spectral transmission characteristics on a light-transmissive substrate using conventional methods.

For the manufacturing methods of color filters, for example, the publications of Japanese Patent Nos. 2040807, 2804541, 4616439, and 4594579 may be referred to.

The light-transmissive substrate is not particularly limited as long as it transmits light in the visible light region, and suitable one may be selected from conventional light-transmissive substrates. Examples of light-transmissive substrates include quartz glass, non-alkali glass, synthesized quartz plates, resin films, and optical resin substrates. The thickness of the substrate is not particularly limited and may be selected appropriately in accordance with the purpose. The thickness of the substrate may be, for example, about 100 μm to 1 mm.

The colored pixels may be formed, for example, by forming a resin composition layer for a color filter in the openings formed on the light-transmissive substrate except for the light shielding portions, and curing the resin composition layer. The arrangement of the colored pixels are not particularly limited, and may be any of conventional arrangements, such as, stripe, mosaic, triangle, and four-pixel arrangement. The width, area, and others of colored pixels may be suitably set.

The thickness of the colored pixel is usually in the range of 1 μm to 5 μm.

Of the colored pixel, the blue pixel will suffice as long as the difference between the maximum value and the minimum value in transmittance in the wavelength range of 420 nm to 460 nm is 4% or less. The blue pixel preferably has an average transmittance of 80% or more in the wavelength range of 400 nm to 500 nm, and preferably has a transmittance of 50% or more in the wavelength range of 720 nm to 780 nm of the spectral transmittance curve. The material for forming a blue pixel is not particularly limited, and a suitable one may be selected from conventional blue pixel-forming materials. In particular, the blue pixel preferably has one of the embodiments described in detail below.

(A) Blue Pixel

The blue-colored layer to be used in the present embodiment may have two embodiments: an embodiment (the first embodiment) containing a colorant represented by formula (I), and an embodiment (the second embodiment) containing a colorant represented by formula (III). The blue pixel of each embodiment (hereinafter also referred to as "blue-colored layer") will be described below.

(a) The First Embodiment

The blue-colored layer of the first embodiment contains a colorant represented by formula (I), and usually further contains, for example, a binder resin.

(i) Colorant

The colorant used in the first embodiment is a compound represented by formula (I).

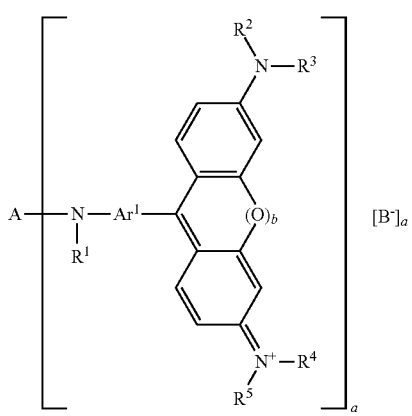

(I)

In formula (I), A is an organic group of "a"-valence in which the carbon atom that is directly bonded with N has no π (pi) bond, and the organic group is an aliphatic hydrocarbon group having a saturated aliphatic hydrocarbon group at least at the terminal which is directly bonded to N, or an aromatic group having such an aliphatic hydrocarbon group, and the carbon chain may contain O, S, or N. B⁻ denotes a monovalent anion. B⁻s may be the same or different. $R^1$ to $R^5$ each independently represent a hydrogen atom, an unsubstituted or substituted alkyl group, or an unsubstituted or substituted aryl group. $R^2$ and $R^3$ as well as $R^4$ and $R^5$ may be bonded to each other to form a ring structure. $Ar^1$ denotes an unsubstituted or substituted divalent aromatic group. $R^1$s to $R^5$s and $Ar^1$s each may be the same or different.

"a" denotes an integer of 2 to 4. "b" is 0 or 1, and if "b" is 0, there is no bond. "b"s may be the same or different.

Cationic Moiety

The cationic moiety in the colorant to be used in the present embodiment is a divalent or higher valent cation having a structure represented by formula (IV). Unlike the conventional triarylmethane basic dyes and xanthene basic dyes, even a chloride of the cationic moiety represented by formula (V) is substantially insoluble in water.

The structure represented by formula (IV) is a divalent or higher valent cation in which cations each containing only one conventional triarylmethane backbone are bonded through "a"-valent covalent bonds.

If it is assumed that the conventional binding species connecting a monocation consisting of a triarylmethane backbone alone and an anion is an ionic bond alone, it may be considered that the binding species of the salt-forming component consisting of the divalent or higher cation of the present embodiment includes covalent bonds that connect monocations in addition to ionic bonds. Therefore, it may be inferred that because the salt-forming component comprising the divalent or higher cation having the structure represented by formula (V) contains an increased amount of stronger binding species throughout the constituent elements, the stability of the salt-forming component increases and the component is unlikely to cause hydration, in comparison to conventional salt-forming components that are composed of one triarylmethane backbone alone. Furthermore, it is assumed that because the molecular weight increases and hydrophobicity of the structure represented by formula (V) becomes higher due to the linking group A, the salt-forming component becomes substantially insoluble in water, in cooperation with the increase in the stability of bonds.

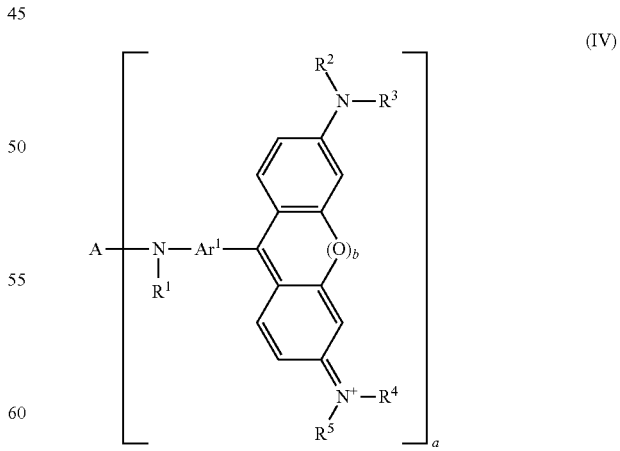

(IV)

In formula (IV), A, $R^1$ to $R^5$, $Ar^1$, and a and b are the same as those defined in formula (I).

In formula (I), b is an integer of 0 or 1. When b is 0, it has a triarylmethane backbone represented by formula (V).

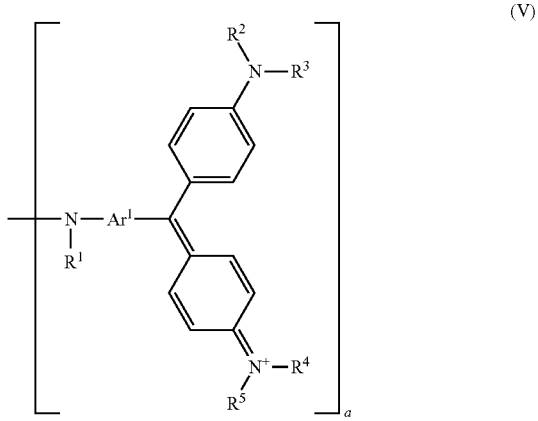

In formula (V), $R^1$ to $R^5$ and $Ar^1$ are the same as those defined in formula (I).

When b is 1, it has a xanthene backbone represented by formula (VI).

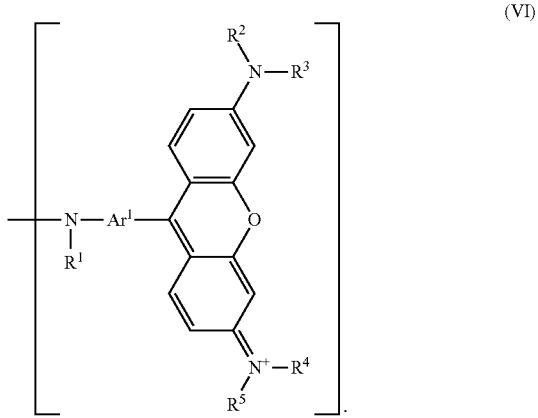

In formula (VI), $R^1$ to $R^5$ and $Ar^1$ are the same as those defined in formula (I).

"b"s may be the same or different. That is, the cationic moiety may have triarylmethane backbones alone or xanthene backbones alone, or the cationic moiety may have both triarylmethane and xanthene backbones per molecule. In view of color purity, the cationic moiety preferably has the same backbones alone. On the other hand, a cationic moiety including both triarylmethane backbones and xanthene backbones, or a combination of the substituents that will be described later enables adjustment of the color of the colorant represented by formula (I) to a desired color.

A in formula (I) is an organic group of "a"-valence in which the carbon atom that is directly bonded with N (nitrogen atom) has no π (pi) bond, and the organic group is an aliphatic hydrocarbon group having a saturated aliphatic hydrocarbon group at least at the terminal which is directly bonded to N, or an aromatic group having such an aliphatic hydrocarbon group, and the carbon chain may include O (oxygen atom), S (sulfur atom), or N (nitrogen atom). Because the carbon atom that is directly bonded with N forms no π bond, the color properties, such as color tone and transmittance, of the color producing moieties are not affected by the linking group A and the other chromogenic moieties, thereby maintaining the same color as that of the color-forming monomer.

In A, the aliphatic hydrocarbon group having a saturated aliphatic hydrocarbon group at least at the terminal directly bonded to N may be linear, branched or cyclic as long as the carbon atom at the terminal directly bonded to N has no π bond. In the aliphatic hydrocarbon group, the carbon atoms other than the one at the terminal may have an unsaturated bond, have a substituent, and the carbon chain may contain O, S or N. For example, a carbonyl group, a carboxyl group, an oxycarbonyl group or an amide group may be contained, and a hydrogen atom may further be substituted with, for example, a halogen atom.

Also in A, examples of the aromatic group having the above-described aliphatic hydrocarbon group include a monocyclic or polycyclic aromatic group having an aliphatic hydrocarbon group with a saturated aliphatic hydrocarbon group at least at the terminal directly bonded to N. The aromatic group may be substituted, and it may be a heterocyclic ring containing O, S or N.

In particular, to enhance backbone toughness "A" preferably includes a cyclic aliphatic hydrocarbon group or an aromatic group.

In particular, to enhance backbone toughness, the cyclic aliphatic hydrocarbon group is preferably a bridged alicyclic hydrocarbon group. A bridged alicyclic hydrocarbon group refers to a polycyclic aliphatic hydrocarbon group that has a bridge structure in the aliphatic ring, and has a polycyclic structure. Examples of the bridged alicyclic hydrocarbon group include norbornane, bicyclo[2.2.2]octane, and adamantane. Of the bridged alicyclic hydrocarbon groups, norbornane is preferable. Examples of the aromatic group include aromatic groups having a benzene ring or a naphthalene ring, and aromatic groups having a benzene ring are particularly preferable.

In view of the ready availability of the raw materials, "A" is preferably divalent. When A is a divalent organic group, examples of the divalent organic group include linear, branched or cyclic alkylene groups having 1 to 20 carbon atoms, and an aromatic group in which two alkylene groups each having 1 to 20 carbon atoms are bound by substitution, such as a xylylene group.

The alkyl group in each of $R^1$ to $R^5$ is not particularly limited. Examples of the alkyl group include linear or branched alkyl groups having 1 to 20 carbon atoms. Of the alkyl groups, preferred are linear or branched alkyl groups having 1 to 8 carbon atoms, more preferred are linear or branched alkyl groups having 1 to 5 carbon atoms, for ease of production and ready availability of the raw materials. Of the alkyl groups, still more preferred are those in which the alkyl group in $R^1$ to $R^5$ is an ethyl group or a methyl group. The substituent that the alkyl group may have is not particularly limited. Examples include an aryl group, a halogen atom, and a hydroxyl group. Examples of the substituted alkyl groups include a benzyl group.

The aryl group in each of $R^1$ to $R^5$ is not particularly limited. Examples include a phenyl group and a naphthyl group. Examples of the substituent that the aryl group may have include an alkyl group and a halogen atom.

"$R^2$ and $R^3$ as well as $R^4$ and $R^5$ may be bonded to each other to form a ring structure" indicate that $R^2$ and $R^3$ as well as $R^4$ and $R^5$ form a ring structure via a nitrogen atom. The ring structure is not particularly limited, and the examples include a pyrrolidine ring, a piperidine ring, and a morpholine ring.

In particular, to increase chemical stability, it is preferred that $R^1$ to $R^5$ each independently be a hydrogen atom, an alkyl group having 1 to 5 carbon atoms or a phenyl group.

Or, it is preferred that $R^2$ and $R^3$ as well as $R^4$ and $R^5$ be bonded together to form a pyrrolidine ring, a piperidine ring, or a morpholine ring.

$R^1$ to $R^5$ may each independently have the above structure. In particular, to increase color purity, it is preferred that $R^1$ be a hydrogen atom. In view of easiness in production and ready availability of the raw materials, it is more preferred that all of $R^2$ to $R^5$ be the same.

The divalent aromatic group in $Ar^1$ is not particularly limited. The aromatic group may be an aromatic hydrocarbon group composed of a carbon ring or a heterocyclic group. Examples of the aromatic hydrocarbon in the aromatic hydrocarbon group include a benzene ring; condensed polycyclic aromatic hydrocarbons such as a naphthalene ring, a tetralin ring, an indene ring, a fluorene ring, an anthracene ring, and a phenanthrene ring; and chain polycyclic hydrocarbon groups such as biphenyl, terphenyl, diphenylmethane, triphenylmethane and stilbene. The chain polycyclic hydrocarbon may have O, S or N in a chain backbone, such as diphenyl ether. On the other hand, examples of the heterocyclic ring in the heterocyclic group include: five-membered heterocyclic rings such as furan, thiophene, pyrrol, oxazole, thiazole, imidazole, and pyrazole; six-membered heterocyclic rings such as pyran, pyrone, pyridine, pyridazine, pyrimidine, and pyrazine; and condensed polycyclic heterocyclic rings such as benzofuran, thionaphthene, indole, carbazole, coumalin, benzo-pyrone, quinoline, isoquinoline, acridine, phthalazine, quinazoline and quinoxaline. These aromatic groups may be substituted.

Examples of the substituent that the aromatic group may have include an alkyl group having 1 to 5 carbon atoms and a halogen atom.

$Ar^1$ is preferably an aromatic group having 6 to 20 carbon atoms, more preferably an aromatic group having a condensed polycyclic carbon ring having 10 to 14 carbon atoms. Still more preferred are a phenylene group and a naphthylene group, because these groups have a simple structure and their raw materials are inexpensive.

$R^1$s per molecule may be the same or different; $R^2$s per molecule may be the same or different; $R^3$s per molecule may be the same or different; $R^4$s per molecule may be the same or different; $R^5$s per molecule may be the same or different; and $Ar^1$s per molecule may be the same or different. The chromogenic moieties can exhibit the same color when, in all of the moieties, $R^1$s are the same; $R^2$s are the same; $R^3$s are the same; $R^4$s are the same; $R^5$s are the same; and $Ar^1$s are the same. In this case, therefore, the colorant can reproduce the same color as that of a single color-forming moiety, which is preferable in view of color purity. On the other hand, it is possible to produce a desired color by selecting at least one element from the group consisting of $R^1$s, $R^2$s, $R^3$s, $R^4$s, $R^5$s and $Ar^1$s and changing it to a different substituent, thereby producing a color obtained from a mixture of several kinds of chromogenic moieties.

Anionic Moiety

In the colorant of the present embodiment, the anionic moiety is a monovalent anion having the structure represented by ($B^-$). The above-described colorant having a monovalent anion highly dissolves in alcohol solvents or ketone solvents, which enables preparation of a colorant solution at a high concentration. Thus the material can be used for dyeing various substrates.

$B^-$ is not particularly limited as long as it is a monovalent anion regardless of whether it is an organic anion or an inorganic anion. An organic anion indicates an anion having at least one carbon atom, and an inorganic anion indicates an anion having no carbon atom. Examples of inorganic anions include halide ions such as fluoride ions, chloride ions, bromide ions, and iodide ion; nitrate ion ($NO^-$), and perchlorate ion ($ClO_4^-$).

When $B^-$ is an organic anion, the structure is not particularly limited. However, it is particularly preferred that if should be an organic group having an anionic substituent.

Examples of the anionic substituent include: imide acid groups such as $—SO_2N^-SO_2CH_3$, $—SO_2N^-COCH_3$, $—SO_2N^-SO_2CF_3$, $—SO_2N^-COCF_3$, $—CF_2SO_2N^-SO_2CH_3$, $—CF_2SO_2N^-COCH_3$, $—CF_2SO_2N^-SO_2CF_3$, and $—CF_2SO_2N^-COCF_3$; and substituents such as $—SO_3^-$, $—CF_2SO_3^-$, $—COO^-$, and $—CF_2COO^-$.

In particular, because of the ready availability of the raw materials, the production cost, and the effect of stabilizing the cation and maintaining the chromogenic state of the colorant, imide acid groups, $—SO_3^-$, $—CF_2SO_3^-$ are preferable and $SO_3^-$ (sulfonate group) are more preferable.

The organic group into which the anionic substituent is introduced is not particularly limited. Examples of the organic group include a linear, branched or cyclic saturated or unsaturated hydrocarbon groups, monocyclic or polycyclic aromatic group and combinations of these groups. In the carbon chain of these organic groups, hetero atoms such as O, S, and N may be contained; a carbonyl group, a carboxyl group, an oxycarbonyl group, and an amide group may be contained; and hydrogen atoms may be substituted. Examples of the substituent that the organic group may have include halogen atoms.

Examples of the organic group into which the anionic substituent is introduced include: organic groups derived from aliphatic hydrocarbon compounds such as cyclopropane, cyclobutane, cyclopentane, cyclohexane, norbornane, bicyclo[2,2,2]hexane, bicyclo[3,2,3]octane and adamantine; and organic groups derived from aromatic hydrocarbon compounds such as benzene, naphthalene, anthracene, phenanthrene, pyrene, triphenylene, fluorene, furan, thiophene, pyrrol, imidazole, pyran, pyridine, pyrimidine, pyrazine, triazine, indole, purine, quinoline, isoquinoline, xanthene and carbazole. Furthermore, the organic group may be substituted, for example, with a halogen atom or an alkyl group. Here, organic groups derived from aliphatic hydrocarbon compounds indicates organic groups formed by removing at least one hydrogen atom from aliphatic hydrocarbon compounds, and the position that the hydrogen atom is removed is not particularly limited. The same can be said about the organic group derived from aromatic hydrocarbon compound(s).

Preferred examples of the organic group into which the anionic substituent is introduced include a monocyclic or polycyclic aromatic hydrocarbon group and a group that is a combination of these groups, because of the easy introduction of the anionic substituent.

If it is not intended to change color by anions, it is preferable to use an organic group having an absorption maximum in the wavelength range of 400 nm or less. Examples of organic groups that have an absorption maximum in the wavelength range of 400 nm or less include: organic groups derived from a condensed polycyclic carbon ring, such as naphthalene, tetralin, indene, fluorene, anthracene and phenanthrene; organic groups derived from a chain polycyclic hydrocarbon, such as biphenyl, terphenyl, diphenylmethane, triphenylmethane and stilbene; organic groups derived from a five-membered heterocyclic ring, such as furan, thiophene, pyrrol, oxazole, thiazole, imidazole and pyrazole; aromatic compounds derived from a six-membered heterocyclic ring, such as pyran, pyrone, pyridine, pyridazine, pyrimidine and pyrazine; and organic groups derived from a condensed polycyclic heterocyclic ring, such as benzofuran, thionaphthene, indole, carbazole, coumalin, benzo-pyrone, quinoline, isoquinoline, acridine, phthalazine, quinazoline and quinoxaline.

Examples of the organic group into which the anionic substituent is introduced include organic groups having a backbone derived from an azo dye, an anthraquinone dye, a triphenylmethane dye, a xanthene dye, a phthalocyanine dye and an indigo dye, which are either an organic compound or an organic metal compound. Alternatively, an organic group derived from conventionally-known acid dyes, direct dyes and acid mordant dyes may be used.

Using a dye-derived backbone, an acid dye, a direct dye, or an acid mordant dye can change the color tone of the resultant colorant, and thus the color tone of the colorant represented by formula (I) may be adjusted to a desired color tone.

Of anions having a backbone derived from dyes, the anion represented by formula (VII) is preferable to enhance heat resistance.

Using an anion of formula (VII) as the anionic moiety of the above-described colorant in combination with the cationic moiety enables adjustment of the colorant to a desired color.

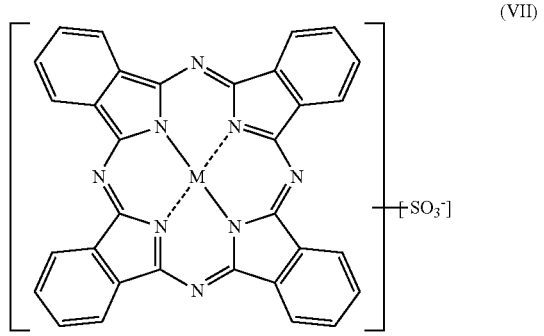

(VII)

In formula (VII), M denotes two hydrogen atoms, or, Cu, Mg, Al, Ni, Co, Fe, or Zn. An aromatic ring is substituted with a sulfonate group (—$SO_3^-$ group).

In the colorant of the present embodiment, the organic anion is preferably an anion represented by formula (VIII) to improve heat resistance.

$Ar^2$-[-$SO_3^-$]　　　　(VIII)

In formula (VIII), $Ar^2$ is an unsubstituted or substituted monovalent aromatic group.

Because the color of the anion of formula (VIII) is colorless to faint yellow, using it as the anionic moiety of the colorant anion allows to almost maintain the color of the cation represented by formula (I) in the resultant colorant.

The aromatic group in $Ar^2$ is not particularly limited. Examples of the aromatic group may include, in addition to carbocyclic aromatic hydrocarbon groups, heterocyclic groups derived from heterocyclic compounds. Examples of the aromatic hydrocarbon group include condensed polycyclic aromatic hydrocarbon groups derived from a naphthalene ring, a tetralin ring, an indene ring, a fluorene ring, an anthracene ring, and a phenanthrene ring, in addition to a benzene ring; and chain polycyclic hydrocarbon groups derived from biphenyl, terphenyl, diphenylmethane, triphenylmethane, and stilbene. The chain polycyclic hydrocarbon group may have a hetero atom such as O and S in the chain backbone, such as diphenyl ether. On the other hand, examples of the heterocyclic compounds include: five-membered heterocyclic compounds such as furan, thiophene, pyrrol, oxazole, thiazole, imidazole and pyrazole; six-membered heterocyclic compounds such as pyran, pyrone, pyridine, pyrone, pyridazine, pyrimidine and pyrazine; and condensed polycyclic heterocyclic compounds such as benzofuran, thionaphthene, indole, carbazole, coumalin, benzo-pyrone, quinoline, isoquinoline, acridine, phthalazine, quinazoline and quinoxaline. These aromatic groups may be substituted.

Examples of the substituents of the aromatic group include an alkyl group having 1 to 5 carbon atoms and a halogen atom.

$Ar^2$ is preferably an aromatic group having 6 to 20 carbon atoms, and more preferably an aromatic group having a condensed polycyclic carbocyclic ring having 10 to 14 carbon atoms. Of them, a phenylene group and a naphthalene group are more preferable because these groups have a simple structure and their raw materials are inexpensive.

In the colorant, the anions (B⁻s) may be the same or different, and an organic anion and an inorganic anion may be used in combination.

Although the average particle size of the colorant is not particularly limited as long as it can form a blue-colored layer, it is preferably within the range of 10 nm to 300 nm, particularly preferably within the range of 20 nm to 200 nm, and most particularly preferably within the range of 30 nm to 100 nm.

The colorant particles having a small average particle size tend to agglomerate, which would make it difficult to uniformly disperse them in the blue-colored layer. On the other hand, the colorants having a large average particle size would make it difficult to form a blue-colored layer with a desired brightness.

The average particle size of the colorant is the particle size of the colorant particles dispersed in a dispersion solvent containing at least a solvent, and is measured by a laser light scattering particle size distribution meter. Measurement of the particle size using a laser light scattering particle size distribution meter includes the steps of preparing a blue dispersion liquid in which the colorant is dispersed; diluting the blue dispersed liquid appropriately to a concentration measurable by the particle size distribution meter (e.g., 1000-fold); and measuring the size using the distribution meter (e.g., a concentrated system particle size analyzer FPAR-1000) by a dynamic light scattering method at 23° C. Here, the average dispersed particle size is a volume average particle size. The blue dispersion liquid may be prepared, for example, by including 5 parts by mass of the colorant, 3 parts by mass of polysulfonic acid polymer dispersant, and 80 parts by mass of 3-methoxybutyl acetate.

Although the amount of the colorant in the blue-colored layer may be appropriately selected according to, for example, the application of the liquid crystal display device of the present embodiment and is not particularly limited, it is preferably within the range of 5 mass % to 50 mass %, particularly preferably within the range of 10 mass % to 40 mass %; and most particularly preferably within the range of 15 mass % to 35 mass %.

With a lower amount of the colorant, the visual quality of the liquid crystal display device would decrease, and with a greater amount of the colorant, the blue-colored layer itself would not be formed.

As for the method of forming the colorant, the method of forming a chloride of a cationic moiety described in publications of Japanese Patents No. 5223980 and No. 5403175 may be employed.

(ii) The Other Materials
Binder Resin

The blue-colored layer used in the present embodiment usually includes a binder resin. The binder resin used in the present embodiment may be the same as those used in colored layers in conventional color filters. Examples of the binder resin include curable resins and photosensitive resins. For example, the photosensitive binder component and the curable binder component used in the colored layer resin composition described in the publications of U.S. Pat. No. 5,223,980 and U.S. Pat. No. 5,403,175 may be used suitably by curing them.

Other Components

The blue-colored layer in the present embodiment usually contains the above-described colorant and a binder resin, and other components may be suitably added as necessary.

Examples of such other components may include an antioxidant. Adding an antioxidant can further increase the heat and light resistance of the blue-colored layer advantageously. Examples of the antioxidant include a primary antioxidant having a free radical-trapping function and a secondary antioxidant having a peroxide degradation function. Either one or both of the two antioxidants may be used.

Examples of the primary antioxidant include 2,6-di-t-butylphenol (molecular weight: 206), 2,6-di-t-butyl-p-cresol (molecular weight: 220) (trade name: Yoshinox BHT (by API Corporation)), 4,4'-butylidene bis(6-t-butyl-3-methylphenol) (molecular weight: 383) (trade name: Yoshinox BB (by API Corporation)), 2,2'-methylenebis(4-methyl-6-t-butylphenol) (molecular weight: 341) (trade name: Yoshinox 2246G (by API Corporation)), 2,2'-methylenebis(4-ethyl-6-t-butylphenol) (molecular weight: 369) (trade name: Yoshinox 425 (by API Corporation)), 2,6-di-t-butyl-4-ethylphenol (molecular weight: 234) (trade name: Yoshinox 250 (by API Corporation)), 1,1,3-tris(2-methyl-4-hydroxy-5-t-butylphenyl)butane (molecular weight: 545) (trade name: Yoshinox 930 (by API Corporation)), n-octadecyl-3-(3,5-di-t-butyl-4-hydroxyphenyl)propionate (molecular weight: 531) (trade name: Tominox SS (by API Corporation), trade name: IRGANOX 1076 (by BASF Japan Ltd.)), tetrakis[methylene-3-(3,5-di-t-butyl-4-hydroxyphenyl)propionate]methane (molecular weight: 1178) (trade name: Tominox TT (by API Corporation), trade name: IRGANOX 1010 (by BASF Japan Ltd.)), triethylene glycol bis[3-(3-t-butyl-4-hydroxy-5-methylphenyl)propionate] (molecular weight: 587) (trade name: Tominox 917 (by API Corporation), trade name: IRGANOX 245 (by BASF Japan Ltd.)), tris(3,5-di-t-butyl-4-hydroxybenzyl)isocyanurate (molecular weight: 784) (trade name: Yoshinox 314 (by API Corporation), trade name: IRGANOX 3114 (by BASF Japan Ltd.)), 3,9-bis[2-[3-(3-t-butyl-4-hydroxy-5-methylphenyl)propionyloxy]-1,1-dimethylethyl]-2,4,8,10-tetraoxaspiro[5,5]-undecane (molecular weight: 741) (trade name: Sumilizer GA-80 (by Sumitomo Chemical Co., Ltd.)), 2,2-thio-diethylene bis[3-(3,5-di-t-butyl-4-hydroxyphenyl)propionate] (molecular weight: 643) (trade name: IRGANOX 1035 (by BASF Japan Ltd.)), N,N'-hexamethylene bis(3,5-di-t-butyl-4-hydroxyhydrocinnamamide) (molecular weight: 637) (trade name: IRGANOX 1098 (by BASF Japan Ltd.)), isooctyl-3-(3,5-di-t-butyl-4-hydroxyphenyl)propionate (molecular weight: 391) (trade name: IRGANOX 1135 (by BASF Japan Ltd.)), 1,3,5-trimethyl-2,4,6-tris(3,5-di-t-butyl-4-hydroxybenzyl) benzene (molecular weight: 775) (trade name: IRGANOX 1330 (by BASF Japan Ltd.)), 2,4-bis(dodecylthiomethyl)-6-methylphenol (molecular weight: 537) (trade name: IRGANOX 1726 (by BASF Japan Ltd.)), a mixture of calcium bis(ethyl 3,5-di-t-butyl-4-hydroxybenzyl phosphonate) and polyethylene wax (molecular weight: 695) (trade name: IRGANOX 1425 (by BASF Japan Ltd.)), 2,4-bis[(octylthio)methyl]-o-cresol (molecular weight: 425) (trade name: IRGANOX 1520 (by BASF Japan Ltd.)), 1,6-hexanediol-bis[3-(3,5-di-t-butyl-4-hydroxyphenyl)propionate] (molecular weight: 639) (trade name: IRGANOX 259 (by BASF Japan Ltd.)), 2,4-bis-(n-octylthio)-6-(4-hydroxy-3,5-di-t-butylanilino)-1,3,5-triazine (molecular weight: 589) (trade name: IRGANOX 565 (by BASF Japan Ltd.)), and diethyl((3,5-bis(1,1-dimethylethyl)-4-hydroxyphenyl) methyl)phosphonate (molecular weight: 356) (trade name: IRGAMOD 95 (by BASF Japan Ltd.)).

Examples of the secondary antioxidant include 6-[3-(3-t-butyl-4-hydroxy-5-methylphenyl)propoxy]-2,4,8,10-tetra-t-butyldibenz[d,f][1,3,2]dioxaphosphepine (molecular weight: 661) (trade name: Sumilizer GP (by Sumitomo Chemical Co., Ltd.)), tris(2,4-di-t-butylphenyl)phosphite (molecular weight: 647) (trade name: IRGAFOS 168 (by BASF Japan Ltd.)), 2-[[2,4,8,10-tetrakis(1,1-dimethylethyl) dibenzo[d,f][1,3,2]dioxaphosphepin-6-yl]oxy]-N,N-bis[2-[[2,4,8,10-tetrakis(1,1-dimethylethyl)dibenzo[d,f][1,3,2]dioxaphosphepin-6-yl]oxy]-ethyl]ethanamine (molecular weight: 1465) (trade name: IRGAFOS 12 (by BASF Japan Ltd.)), bis(2,4-di-t-butyl-6-methylphenyl)ethyl phosphite (molecular weight: 514) (trade name: IRGAFOS 38 (by BASF Japan Ltd.)), dilauryl thiodipropionate (molecular weight: 515) (trade name: DLTP "Yoshitomi" (by API Corporation), trade name: IRGANOX PS 800 FD (by BASF Japan Ltd.)), distearyl thiodipropionate (molecular weight: 683) (trade name: DSTP "Yoshitomi" (by API Corporation), trade name: IRGANOX PS 802 FD (by BASF Japan Ltd.)), dimyristylthiodipropionate (molecular weight: 571) (trade name: DSTP "Yoshitomi" (by API Corporation), trade name: Sumilizer TPM (by Sumitomo Chemical Co., Ltd.)), ditridecyithiodipropionate (molecular weight: 543) (trade name: DTTP (by API Corporation), and pentaerythrityl tetrakis(3-laurylthiopropionate) (molecular weight: 1162) (trade name: Sumilizer TP-D (by Sumitomo Chemical Co., Ltd.)).

Although the amount of the antioxidant in the blue-colored layer is not particularly limited and may be suitably selected depending on the type of the antioxidant, it is preferably within the range of 0.001 mass % to 5 mass %, particularly preferably within the range of 0.01 mass % to 1 mass %, and most particularly preferably within the range of 0.05 mass % to 0.5 mass %.

(iii) Others

The thickness, the arrangement and the method of forming the blue-colored layer has been described above and thus the explanation here will be omitted.

(b) The Second Embodiment

The blue-colored layer of the second embodiment contains a colorant represented by formula (III), and usually further contains a binder resin.

The blue-colored layer of the second embodiment has the same structure as that of the first embodiment except that it contains a colorant represented by formula (III).

Hereinafter, the colorant used in the present embodiment will be described.

The colorant used in the present embodiment is a compound represented by formula (III).

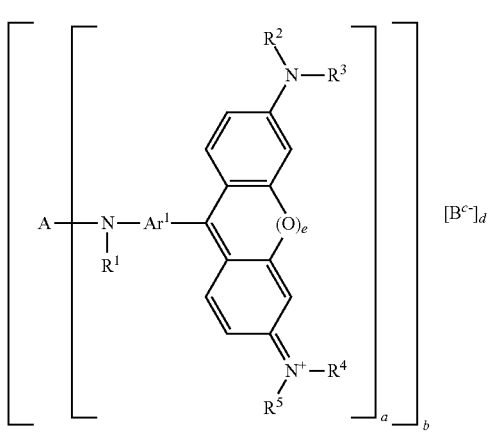

(III)

In formula (III), A is an organic group of "a"-valence in which the carbon atom that is directly bonded with N has no π (pi) bond, and the organic group is an aliphatic hydrocarbon group having a saturated aliphatic hydrocarbon group at least at the terminal which is directly bonded to N, or an aromatic group having such an aliphatic hydrocarbon group, and the carbon chain may include O, S or N. $B^{c-}$ denotes a "c"-valent anion. $R^1$ to $R^5$ are each independently a hydrogen atom, an unsubstituted or substituted alkyl group, or an unsubstituted or substituted aryl group. $R^2$ and $R^3$ may be bonded to form a ring structure, and $R^4$ and $R^5$ may be bonded to form a ring structure. $Ar^1$ denotes an unsubstituted or substituted divalent aromatic group. R's each may be the same or different; $R^2$s each may be the same or different; $R^3$s each may be the same or different; $R^4$s each may be the same or different; $R^5$s each may be the same or different; and $Ar^1$s may be the same or different.

"a" denotes an integer of 2 to 4, "c" denotes an integer of 2 or more, and "b" and "d" are an integer of 1 or more. "e" is 0 or 1, and when e is 0, and there is no bond. "e"s may be the same or different.

Using the colorant of formula (III) produces a colored layer of the color filter having a high contrast that is solvent-resistant, and electrically reliable.

Conventional dyes are generally soluble in solvents. As a means to reduce solubility, a method of making dyes into a salt-forming compound has been used. An example of the method of making a triarylmethane dye into a salt-forming compound is a method of using a divalent anion as a counter anion. This method allows a divalent counter anion to be ionically bonded with two dye cations, thereby reducing the solubility of the dye in a solvent compared to the original dye. Even a colored layer in which a salt-forming compound obtained by such a method is used, the dye may dissolved by solvents used for forming an orientation membrane, resulting in decrease in electrical reliability. Furthermore, the liquid crystal cells may be contaminated with ionic impurities, which may trigger another problem such as burning.

The colorant represented by formula (III) according to the present embodiment has, together with divalent or higher valent anions [$B^{C-}$], divalent or higher valent cations in which two or more cationic chromogenic moieties are bonded via A. For example, when anions and cations are both divalent ions in an agglomerate of the colorant, the anions and cations are not simply ionically bonded in a molecular-to-molecular manner, but multiple molecules are associated through series of ionic bonding, thereby forming a molecular association. Because such a molecular association behaves like one molecule in the agglomerate of the colorant, the apparent molecular weight significantly increases compared with the molecular weights of conventional salt-forming compounds. Furthermore, because of the formation of the molecular association, the agglomeration force in a state of solid further increases. This reduces thermal motion, and further increases electric stability, which is considered to reduce dissociation of ionic pairs and decomposition of cationic moieties. Consequently, the solvent-resistance of the colorants represented by formula (III) improves, and thus the solvent-resistance and electrical reliability of the colored layer including the colorant increases. These mechanisms are considered to be working. Furthermore, because the motility of the ion pairs decreases in the fine particles in which multiple molecules are associated through ionic bonding, it is possible to reduce decreases of contrast caused by the re-agglomeration of fine particles.

Because hydrocarbons in the linking group A, which is directly bonded to cationic chromogenic moiety, have no π bond in the colorant represented by formula (III), the color properties such as color tone and transmittance of the cationic chromogenic moiety have almost no change before and after the introduction of the linking group A.

Figure 4:
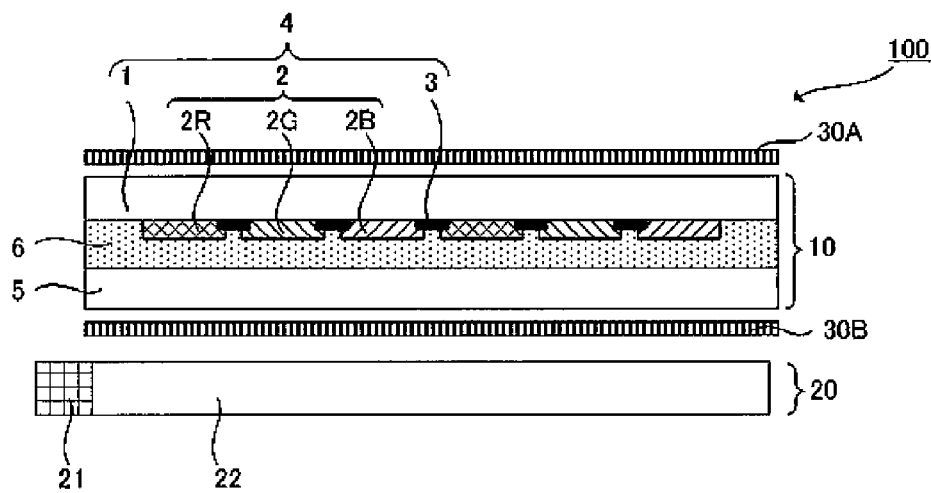
FIG. 4 is a schematic sectional view showing a structural example of an image display device according to the present embodiment.

The electrical reliability can be evaluated by the voltage retention rate when the liquid crystal cell portion 10 as shown in FIG. 4 is formed. "The electrical reliability is high" means that the voltage retention rate is high. "The electrical reliability is low" means that a predetermined voltage is not applied to the liquid crystal layer, which causes problems such as insufficient contrast in liquid crystal cells.

Hereinafter, the anionic moiety and the cationic moiety of the colorant will be described.

(i) Cationic Moiety

Because the cationic moiety is same as the one described with regard to formula (I), the explanation here will be omitted. Note that "e" in formula (III) corresponds to "b" in formula (I).

(ii) Anionic Moiety

The anionic moiety is a divalent or higher valent anion having a structure represented by ($B^{c-}$). $B^{c-}$ is not particularly limited as long as it is a divalent or higher valent anion, regardless of whether it is an organic anion or an inorganic anion. An organic anion indicates an anion having at least one carbon atom, and an inorganic anion indicates an anion having no carbon atom.

Although the structure of $B^{c-}$ as an organic anion is not particularly limited, it is preferable that $B^{c-}$ should be an organic group having an anionic substituent.

Examples of the anionic substituent include imide acid groups such as $-SO_2N^-SO_2CH_3$, $-SO_2N^-COCH_3$, $-SO_2N^-SO_2CF_3$, $-SO_2N^-COCF_3$, $-CF_2SO_2N\ SO_2CH_3$, $-CF_2SO_2N^-COCH_3$, $-CF_2SO_2N^-SO_2CF_3$, and $-CF_2SO_2N^-COCF_3$; and substituents such as $-SO_3^-$, $-CF_2SO_3^-$, $-PO_3^{2-}$, $-COO^-$, $-CF_2PO_3^{2-}$, and $-CF_2COO^-$.

In particular, it is preferred that two or more monovalent anionic substituents be used to stabilize the cations and stabilize the chromogenic effect of the colorant. Furthermore, imide acid groups, $-SO_3^-$, $-CF_2SO_3^-$ are preferable and $SO_3^-$ (sulfonate group) are more preferable because of the ready availability of the raw materials, the production cost, and the effect of stabilizing the cation and maintaining the chromogenic state of the colorant.

When multiple anionic substituents are introduced, they may be the same or different substituents.

The organic group into which the anionic substituent is introduced is not particularly limited. Examples of the organic group include a linear, branched or cyclic saturated or unsaturated hydrocarbon groups, monocyclic or polycyclic aromatic group and combinations of these groups. In the carbon chain of these organic groups, a hetero atom such as O, S, and N may be contained, a carbonyl group, a carboxyl group, an oxycarbonyl group and an amide group may be contained, and hydrogen atoms may be substituted. Examples of the substituent that the organic group may have include halogen atoms.

Examples of the organic group into which the anionic substituent is introduced include: organic groups derived from aliphatic hydrocarbon compounds such as cyclopropane, cyclobutane, cyclopentane, cyclohexane, norbornane, bicyclo[2,2,2]hexane, bicyclo[3,2,3]octane and adamantine; and organic groups derived from aromatic compounds such as benzene, naphthalene, anthracene, phenanthrene, pyrene, triphenylene, fluorene, furan, thiophene, pyrrol, imidazole, pyran, pyridine, pyrimidine, pyrazine, triazine, indole, purine, quinoline, isoquinoline, xanthene and carbazole. Furthermore, the organic group may be substituted with, for example, a halogen atom or an alkyl group.

As the organic group into which the anionic substituent is introduced, preferred are a monocyclic or polycyclic aromatic hydrocarbon group and a group that is a combination of these groups, because of the easy introduction of the anionic substituent.

If it is not intended to change color by anions, it is preferable to use an organic group having an absorption maximum in the wavelength range of 400 nm or less. Examples of the organic groups that have an absorption maximum in the wavelength range of 400 nm or less include organic groups derived from a condensed polycyclic carbon ring, such as naphthalene, tetralin, indene, fluorene, anthracene, and phenanthrene; organic groups derived from a chain polycyclic hydrocarbon, such as biphenyl, terphenyl, diphenylmethane, triphenylmethane and stilbene; organic groups derived from a five-membered heterocyclic ring, such as furan, thiophene, pyrrol, oxazole, thiazole, imidazole, and pyrazole; aromatic compounds derived from a six-membered heterocyclic ring, such as pyran, pyrone, pyridine, pyridazine, pyrimidine or pyrazine; and organic groups derived from a condensed polycyclic heterocyclic ring, such as benzofuran, thionaphthene, indole, carbazole, coumalin, benzo-pyrone, quinoline, isoquinoline, acridine, phthalazine, quinazoline and quinoxaline.

Examples of the organic group into which the anionic substituent is introduced include organic groups having a backbone derived from an azo dye, an anthraquinone dye, a triphenylmethane dye, a xanthene dye, a phthalocyanine dye and an indigo dye, which are either an organic compound or an organic metal compound. Alternatively, an organic group derived from conventionally-known acid dyes, direct dyes and acid mordant dyes may be used.

Using a dye-derived backbone, an acid dye, a direct dye, an acid mordant dye can change the color tone of the resultant colorant, and thus the color tone of the colorant represented by formula (III) may be adjusted to a desired color tone.

Examples of acid dyes include C.I. acid yellow 1, 3, 7, 9, 11, 17, 23, 25, 29, 34, 36, 38, 40, 42, 54, 65, 72, 73, 76, 79, 98, 99, 111, 112, 113, 114, 116, 119, 123, 128, 134, 135, 138, 139, 140, 144, 150, 155, 157, 160, 161, 163, 168, 169, 172, 177, 178, 179, 184, 190, 193, 196, 197, 199, 202, 203, 204, 205, 207, 212, 214, 220, 221, 228, 230, 232, 235, 238, 240, 242, 243, 251, C.I. acid red 1, 4, 8, 14, 17, 18, 26, 27, 29, 31, 34, 35, 37, 42, 44, 50, 51, 52, 57, 66, 73, 80, 87, 88, 91, 92, 94, 97, 103, 111, 114, 129, 133, 134, 138, 143, 145, 150, 151, 158, 176, 182, 183, 198, 206, 211, 215, 216, 217, 227, 228, 249, 252, 257, 258, 260, 261, 266, 268, 270, 274, 277, 280, 281, 195, 308, 312, 315, 316, 339, 341, 345, 346, 349, 382, 383, 394, 401, 412, 417, 418, 422, 426, C.I. acid ORANGE 6, 7, 8, 10, 12, 26, 50, 51, 52, 56, 62, 63, 64, 74, 75, 94, 95, 107, 108, 169, 173, C.I. acid blue 1, 7, 9, 15, 18, 23, 25, 27, 29, 40, 42, 45, 51, 62, 70, 74, 80, 83, 86, 87, 90, 92, 96, 103, 112, 113, 120, 129, 138, 147, 150, 158, 171, 182, 192, 210, 242, 243, 256, 259, 267, 278, 280, 285, 290, 296, 315, 324:1, 335, 340, C.I. acid violet 613, 7, 9, 17, 19, and C.I. acid green 1, 3, 5, 9, 16, 25, 27, 50, 58, 63, 65, 80, 104, 105, 106, 109.

Examples of direct dyes include C.I. DIRECT yellow 2, 33, 34, 35, 38, 39, 43, 47, 50, 54, 58, 68, 69, 70, 71, 86, 93, 94, 95, 98, 102, 108, 109, 129, 136, 138, 141, C.I. DIRECT red 79, 82, 83, 84, 91, 92, 96, 97, 98, 99, 105, 106, 107, 172, 173, 176, 177, 179, 181, 182, 184, 204, 207, 211, 213, 218, 220, 221, 222, 232, 233, 234, 241, 243, 246, 250, C.I. DIRECT ORANGE 34, 39, 41, 46, 50, 52, 56, 57, 61, 64, 65, 68, 70, 96, 97, 106, 107, C.I. DIRECT blue 57, 77, 80, 81, 84, 85, 86, 90, 93, 94, 95, 97, 98, 99, 100, 101, 106, 107, 108, 109, 113, 114, 115, 117, 119, 137, 149, 150, 153, 155, 156, 158, 159, 160, 161, 162, 163, 164, 166, 167, 170, 171, 172, 173, 188, 189, 190, 192, 193, 194, 196, 198, 199, 200, 207, 209, 210, 212, 213, 214, 222, 228, 229, 237, 238, 242, 243, 244, 245, 247, 248, 250, 251, 252, 256, 257, 259, 260, 268, 274, 275, 293, C.I. DIRECT violet 47, 52, 54, 59, 60, 65, 66, 79, 80, 81, 82, 84, 89, 90, 93, 95, 96, 103, 104, and C.I. DIRECT green 25, 27, 31, 32, 34, 37, 63, 65, 66, 67, 68, 69, 72, 77, 79, 82.

Examples of the acid mordant dyes include C.I.MORDANT yellow 5, 8, 10, 16, 20, 26, 30, 31, 33, 42, 43, 45, 56, 61, 62, 65, C.I.MORDANT red 1, 2, 3, 4, 9, 11, 12, 14, 17, 18, 19, 22, 23, 24, 25, 26, 30, 32, 33, 36, 37, 38, 39, 41, 43, 45, 46, 48, 53, 56, 63, 71, 74, 85, 86, 88, 90, 94, 95, C.I.MORDANT ORANGE 3, 4, 5, 8, 12, 13, 14, 20, 21, 23, 24, 28, 29, 32, 34, 35, 36, 37, 42, 43, 47, 48, C.I.MORDANT blue 1, 2, 3, 7, 8, 9, 12, 13, 15, 16, 19, 20, 21, 22, 23, 24, 26, 30, 31, 32, 39, 40, 41, 43, 44, 48, 49, 53, 61, 74, 77, 83, 84, C.I.MORDANT violet 1, 2, 4, 5, 7, 14, 22, 24, 30, 31, 32, 37, 40, 41, 44, 45, 47, 48, 53, 58, and C.I.MORDANT green 1, 3, 4, 5, 10, 15, 19, 26, 29, 33, 34, 35, 41, 43, 53.

Of these dyes, if the dye itself is a divalent or higher valent anion, the dye may be used, as it is, as an anionic moiety in the colorant of the present embodiment. If the dye itself is not a divalent or higher valent anion, an anionic substituent is appropriately introduced so that it becomes a divalent or higher valent anion.

In particular, the above-described organic anion is preferably one or more selected from the group consisting of the anions represented by the formulae (IX), (X), and (XI) to improve the solvent-resistance and electrical reliability.

$$Ar^2 + SO_3^-]_c \qquad (IX)$$

In formula (IX), $Ar^2$ is an unsubstituted or substituted aromatic group of "c"-valence. "c" is an integer of 2 or more.

(X)

In formula (X), R⁶ is a hydrogen atom or a methyl group. Ar³ is an unsubstituted or substituted aromatic group. Q denotes a direct bond or a divalent linking group. "f" denotes an integer of 1 or more. "g" denotes an integer of 2 or more.

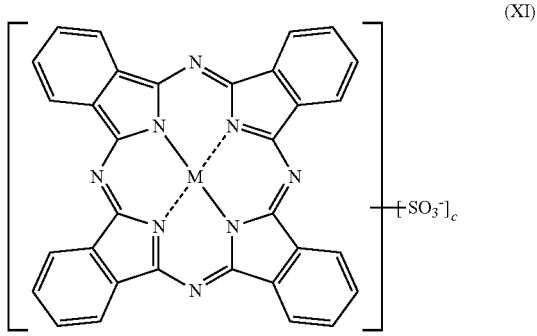

(XI)

In formula (XI), M denotes two hydrogen atoms, or, Cu, Mg, Al, Ni, Co, Fe, or Zn. The sulfonate group (—SO₃⁻ group) is introduced into an aromatic ring, and "c" is an integer of 2 to 4.

Because the color of the anion of formula (IX) is colorless to faint yellow when used as the anionic moiety of the colorant, using it as the anionic moiety of the colorant anion allows to almost maintain the color of the cation represented by formula (III) in the resultant colorant.

Because the anion valence increases, using the anion of formula (X) as the anion moiety of the colorant may enable interaction with a greater number of cations represented by formula (III). This results in the characteristics of greater agglomeration and less solubility in solvents.

Using an anion of formula (XI) as the anionic moiety of the colorant in combination with the cationic moiety enables adjustment of the color of the colorant.

The aromatic groups in Ar² and Ar³ are not particularly limited. The aromatic group may be an aromatic hydrocarbon group composed of a carbon ring or a heterocyclic group derived from a heterocyclic compound. Examples of the aromatic hydrocarbon group include: a benzene ring; condensed polycyclic aromatic hydrocarbon groups derived from, e.g., a naphthalene ring, a tetralin ring, an indene ring, a fluorene ring, an anthracene ring and a phenanthrene ring; and chain polycyclic hydrocarbon groups derived from e.g., biphenyl, terphenyl, diphenylmethane, triphenylmethane and stilbene. The chain polycyclic hydrocarbon group may have a hetero atom such as O and S in a chain backbone, such as diphenyl ether. Alternative examples of the heterocyclic compound may include five-membered heterocyclic ring compounds such as furan, thiophene, pyrrol, oxazole, thiazole, imidazole and pyrazole; six-membered heterocyclic ring compounds such as pyran, pyrone, pyridine, pyridazine, pyrimidine and pyrazine; and condensed polycyclic heterocyclic ring compounds such as benzofuran, thionaphthene, indole, carbazole, coumalin, benzo-pyrone, quinoline, isoquinoline, acridine, phthalazine, quinazoline and quinoxaline. These aromatic groups may be further substituted.

Examples of the substituents on the aromatic group include alkyl groups having 1 to 5 carbon atoms and halogen atoms.

Ar² and Ar³ are preferably an aromatic group having carbon atoms of 6 to 20, and more preferably a condensed polycyclic carbocyclic aromatic group having carbon atoms of 10 to 14. Of them, benzene-derived groups and naphthalene-derived groups are more preferable because these groups have a simple structure and their raw materials are inexpensive.

In formula (X), Q denotes a direct bond or a divalent linking group.

Examples of the divalent linking group include alkylene groups having 1 to 10 carbon atoms, arylene groups, —CONH— groups, —COO— groups; ether groups having 1 to 10 carbon atoms (—R'—OR"—: R' and R" are each independently an alkylene group) and a combination of these groups. In particular, Q is preferably a direct bond, or —COO— group.

In formula (X), "f" is not particularly limited as long as it is an integer of 1 or more. "f" is more preferably 1 because of the ready availability of the raw materials.

Furthermore, "g" is an integer of 2 or more. In particular, "g" is preferably 50 or more and is more preferably 80 or more to achieve high heat resistance. On the other hand, "g" is preferably 3000 or less, and more preferably 2000 or less to achieve desirable solubility. The weight-average molecular weight of formula (X) is preferably 10000 to 100000. Here, "weight-average molecular weight" is a value in standard polystyrene equivalence as determined by Gel Permeation Chromatography (GPC). The measurement was performed using HLC-8120GPC by Tosoh Corporation, under the following conditions: eluting solvent: N-methyl pyrolidone to which 0.01 mol/liter of lithium bromide was added; polystyrene standards for calibration curve: Mw377400, 210500, 96000, 50400, 206500, 10850, 5460, 2930, 1300, 580 (Easi P5-2 series by Polymer Laboratories), and Mw1090000 (by Tosoh Corporation); and measurement column: TSK-GEL ALPHA-M x 2 (by Tosoh Corporation).

In formula (X), when there are multiple particular constituent units, all of them may be the same, or two or more identical ones may be included among them. In formula (X), the total of "f"s corresponds to "c" in formula (III).

Meanwhile, if $B^{c-}$ is an inorganic anion, the structure and composition are not particularly limited as long as it is an inorganic oxo acid or a dehydrated condensate thereof. Examples of the inorganic anion include divalent or higher valent oxo acidic anions (e.g., phosphate ion, sulfate ion, chromate ion, tungstate ion ($WO_4^{2-}$), molybdate ion ($MoO_4^{2-}$)), inorganic anions such as polyacid ions in which multiple oxo acids are condensed, and a mixture thereof.

The above-mentioned polyacid may be an isopolyacid ion $(M_mO_n)^{c-}$ or a heteropolyacid ion $(X_lM_mO_n)^{c-}$. In the ionic formula, M denotes a polyatom; X denotes a hetero atom; m denotes a composition ratio of the polyatom; and n denotes a composition ratio of the oxygen atom. Examples of the polyatom M include Mo, W, V, Ti, and Nb. Examples of the hetero atom X include Si, P, As, S, Fe, and Co.

The inorganic acidic anion preferably contains at least one of molybdenum (Mo) and tungsten (W), in particular, to achieve high heat resistance.

In the present embodiment, the inorganic acidic anion is preferably a polyacid anion containing at least one of molybdenum (Mo) and tungsten (W). Two additional embodiments are described as suitable embodiments.

The anionic moiety ($B^{c-}$) of the colorant of the first embodiment is a polyacid anion of "c"-valence containing molybdenum and tungsten in which the molar ratio of molybdenum to tungsten is 0.4:99.6 to 15:85. The anionic moiety ($B^{c-}$) of the colorant of the second embodiment is a polyacid anion of "c"-valence containing at least tungsten in which the molar ratio of molybdenum to tungsten is less than 0.4/99.6.

In the present embodiment, the molar ratios of molybdenum and tungsten indicate the molar ratio of molybdenum atoms and the molar ratio of tungsten atoms in the entire colorant represented by formula (I), whereas the molar ratio of molybdenum to tungsten indicates the value of the molar ratio of molybdenum atoms to tungsten atoms in the entire colorant represented by formula (I).

Although the action caused by the above-described specific combination that exhibits advantageous effects like those described above is yet to be clarified, it is inferred as follows.

Cationic colorants are generally known to be oxidized and discolored by light. Meanwhile, it is known that polyacids containing tungsten or molybdenum are photoreductive, and that the photoreduction reaction is reversible. It may be inferred that the oxidization reaction of cations due to light can be suppressed by using such a polyacid as an anion, resulting in improved light resistance. Although the mechanism is yet to be clarified, it may be inferred that mixing tungsten-containing polyacid anions with molybdenum-containing polyacid anions, which differ in electronic state, in a specific ratio produces a superior effect of suppressing the oxidization reaction.

The colorant of the first embodiment contains a divalent or higher valent polyacid anion, containing, as a counter anion, molybdenum and tungsten, in which the molar ratio of molybdenum to tungsten is 0.4:99.6 to 15:85. Mixing a small amount of polyacid anion that contains molybdenum can improve the light resistance and even the heat resistance of the colorant compared with the case where only a polyacid anion containing tungsten is used. It is believed that heat resistance is particularly improved when cations form ionic pairs with polyacid anions that contain tungsten. Tungsten-containing polyacid anions, however, have a large ionic size, leaving voids between them and cations. Meanwhile, molybdenum-containing polyacid anions are considered to have a smaller ionic size than that of the tungsten-containing polyacid anions. The colorant used in the present embodiment contains a small amount of molybdenum-containing polyacid anions having a still smaller ionic size, so that the molybdenum-containing polyacid anions are believed to enter the voids created between cations and the tungsten-containing polyacid anions when they form ionic pairs. This may be attributable to the improved heat resistance and light resistance of the colorant. When a heteropolyacid containing both molybdenum and tungsten is used, the heteropolyacid itself is considered to have a variation in ionic size, so that part of the heteropolyacid having a smaller ionic size enters into the voids between heteropolyacid having a larger size and the cations, leading to improved heat resistance and light resistance of the colorant.

In contrast, the colorant of the second embodiment includes a divalent or higher valent polyacid anion containing, as a counter anion, at least tungsten, in which the molar ratio of molybdenum to tungsten is less than 0.4/99.6. As stated above, when the cation forms an ionic pair with a polyacid anion containing tungsten, the heat resistance improves, comparable to the heat resistance of the colorant of the first embodiment. In the application to color filters, colored layers having particularly high brightness are required. The present inventors made a detailed study of heat resistance. The study revealed that when the proportion of the molybdenum in the polyacid anion is low, e.g., the molar ratio of molybdenum to the tungsten is less than 0.4/99.6, or in the case where the polyacid anion contains tungsten alone and no molybdenum, brightness after exposure to light is high compared with the colorant of the first embodiment, and the decrease in brightness of the colored layer after heating at high temperatures is less than that of the colorant of the first embodiment. Although the action to exhibit such effects are yet to be clarified, the colored layer using such a colorant of the second embodiment can achieve higher brightness.

Consequently, the colorant represented by formula (III) is particularly superior in heat resistance and light resistance. Thus, a colorant capable of forming a blue-colored layer superior in heat resistance and light resistance while achieving a high degree of brightness comparable to that of dyes can be obtained.

The polyacid anion may be an isopolyacid ion $(M_mO_n)^{c-}$ or a heteropolyacid ion $(X_lM_mO_n)^{c-}$. In the ionic formula, M denotes polyatomic ions; X denotes hetero atomic ions; m denotes a composition ratio of polyatomic ions; and n denotes a composition ratio of oxygen atomic ions. Polyatomic ions M must include either Mo (molybdenum ions) or W (tungsten ions). Polyatomic ions M may include two or more different polyatomic ions. Polyatomic ions M are preferably at least either Mo or W. Examples of the hetero atomic ions X include Si, P, As, S, Fe, and Co. In addition, counter cations such as $Na^+$ and $H^+$ may be partially contained.

Specific examples of polyacid anions containing at least one of molybdenum and tungsten include kegging-type phosphotungsten acid ions: $\alpha\text{-}[P_2W_{12}O_{40}]^{3-}$; Dawson-type phosphotungsten ions: $\alpha\text{-}[P_2W_{18}O_{62}]^{6-}$, $\beta\text{-}[P_2W_{18}O_{62}]^{6-}$; Kegging-type silicotungstic acid ions: $\alpha\text{-}[SiW_{12}O_{40}]^{4-}$, $\beta\text{-}[SiW_{12}O_{40}]^{4-}$, $\gamma\text{-}[SiW_{12}O_{40}]^{4-}$; and the other examples include $[P_2W_{17}O_{61}]^{10-}$, $[P_2W_{15}O_{56}]^{12-}$, $[H_2P_2O_{48}]^{12-}$, $[NaP_5W_{30}O_{110}]^{14-}$, $\alpha\text{-}[SiW_9O_{34}]^{10-}$, $\gamma\text{-}[SiW_{10}O_{36}]^{8-}$, $\alpha\text{-}[SiW_{11}O_{39}]^{8-}$, $\beta\text{-}[SiW_{11}O_{39}]^{8-}$, $[W_6O_{19}]^{2-}$, $[W_{10}O_{32}]^{4-}$, $WO_4^{2-}$, $\alpha\text{-}[PMo_{12}O_{40}]^{3-}$, $\alpha\text{-}[PW_{11}MoO_{40}]^{3-}$, $\alpha\text{-}[PW_9Mo_3O_{40}]^{3-}$, $\alpha\text{-}[PW_3Mo_9O_{40}]^{13-}$, $\alpha\text{-}[SiMo_{12}O_{40}]^{4-}$, $\alpha\text{-}[P_2Mo_{18}O_{62}]^{6-}$, $[Mo_2O_7]^{2-}$, $[Mo_6O_{19}]^{2-}$, and $[Mo_8O_{26}]^{4-}$.

Of the above, the inorganic acid anion containing at least either molybdenum or tungsten is preferably heteropolyacid, and more preferably heteropolyacid further containing P (phosphorus) to achieve high heat resistance and light resistance and because of the ready availability of the raw materials.

The polyacid anion in the colorant of the first embodiment may include one of the above-mentioned anions alone or two or more in combination. Any combination of anions may be used as long as the molar ratio of molybdenum to tungsten is 0.4:99.6 to 15:85 in the entire polyacid anion. In particular, the molar ratio of molybdenum to tungsten is preferably 0.8:99.2 to 13:87, and more preferably 1.0:99.0 to 10:90 to achieve superior heat resistance and light resistance.

The polyacid anion in the colorant of the second embodiment may include one of the above-mentioned anions alone or two or more in combination. Any combination of anions may be used as long as the molar ratio of molybdenum to tungsten is less than 0.4/99.6 in the entire polyacid anion. In particular, the molar ratio of molybdenum to tungsten is preferably 0.3/99.7 or less to increase heat resistance. This range includes the case where tungsten alone is used and no molybdenum is used as the polyatoms, i.e., the molar ratio of molybdenum to tungsten in the polyacid anion is 0:100.

In formula (III), "a" denotes the number of the chromogenic cationic moieties constituting the cation, and is an integer of 2 to 4. That is, in the colorant used in the present embodiment, the cation has a valence of 2 or more, and the anion has a valence of 2 or more. Hence, the above-described molecular association is formed, resulting in improved heat resistance and light resistance. Although "a" is 4 or less, "a" being 3 or less is more preferable for ease of production.

In formula (III), "b" denotes the number of cationic molecules in a molecular association, "d" denotes the number of anionic molecules in the molecular association, and "b" and "d" is an integer of 1 or more. In the colorant of the present embodiment in the form of crystals or agglomerates, "b" and "d" are each not necessarily 1, and can be any of 2, 3, 4 . . . i.e., any of 2 or more natural numbers. In the colorant in the present embodiment, at least a portion of it preferably forms a molecular association wherein b≥2, to achieve desirable heat resistance and light resistance. Furthermore, in the colorant in the present embodiment, at least a portion of it preferably forms a molecular association wherein d≥2 to achieve desirable heat resistance and light resistance.

If b is 2 or more, a plurality of cations present in the molecular association may be made of one type or a combination. Furthermore, if "d" is 2 or more, a plurality of anions present in the molecular association may be made of one type or a combination, and an organic anion and an inorganic anion may be used in combination.

The average particle size of the colorant and the amount of the colorant in the blue-colored layer may be the same as those described in the section of the blue-colored layer in the first mode, and thus the description here will be omitted.

As for the method for preparing the above-described colorants, the methods disclosed in U.S. Pat. No. 5,223,980 and No. 5403175 may be employed.

(Light Emitting Device)

The light emitting device according to the present embodiment includes a nitride semiconductor light-emitting element (hereinafter also simply referred to as "light emitting element") as a light source, having an emission peak wavelength in the wavelength range of 240 nm to 560 nm. The light emitting device also includes an $Mn^{4+}$-activated red fluorescent material having a maximum excitation wavelength in the 240 nm to 560 nm range, an emission peak wavelength in a range of 610 nm to 670 nm, and a half bandwidth of emission spectrum of 30 urn or less. The light emitting device further includes a green fluorescent material having an emission peak wavelength in the wavelength range of 510 nm to 550 nm.

Combining a light emitting device including a nitride semiconductor light-emitting element having an emission peak wavelength in a specific wavelength range and an $Mn^{4+}$-activated red fluorescent material having specific fluorescent properties, with a color filter having the above-described spectral transmission characteristics enables configuration of an image display device with stable display of white point, high white brightness and high color purity.

The structure of the light emitting device may be appropriately selected from conventional structures. An example of the structure of the light emitting device is a structure in which a light emitting element, as a light source, is encapsulated with an encapsulation resin containing a red fluorescent material and a green fluorescent material.

The type of the light emitting device is not particularly limited, and any conventional type may be appropriately selected. Examples of the type of the light emitting device include shell type and surface mount type. Generally, the shell type indicates a light emitting device having a shell-shaped outer surface made of resin. The surface mount type indicates a light emitting device having a recess that stores a light emitting element as a light source and is filled with a resin. Another type of the light emitting device is a lens-shaped light emitting device. The lens-shaped light emitting device includes a light emitting element as a light source that is mounted on a flat-plate mounting board, and a lens-shaped encapsulation resin formed in a manner to cover the light emitting element.

An example of the light emitting device according to an embodiment of the present invention will be explained below with reference to the drawings. FIG. 1 is a schematic sectional view showing an example of a light emitting device according to the present invention. The light emitting device is an example of surface-mounted light emitting devices.

The light emitting device 200 includes a light emitting element 210 (light source) composed of a gallium nitride compound semiconductor that emits short-wavelength visible light (e.g., 380 nm to 485 nm); and a molded body 240 on which a light emitting element 210 is disposed. The molded body 240 includes the first lead 220 and the second lead 230, and is integrally formed of a thermoplastic resin or a thermosetting resin. The molded body 240 has a recess defined by a bottom surface and side surfaces, and the light emitting element 210 is disposed on the bottom surface of the recess. The light emitting element 210 has a pair of electrodes, positive and negative, and the pair of the electrodes is electrically connected to the first lead 220 and the second lead 230 with a wire. The light emitting element 210 is encapsulated by an encapsulation member 250. The encapsulation member 250 is preferably a thermosetting resin such as epoxy resin, silicone resin, epoxy-modified silicone resin, and modified silicone resin. The encapsulation member 250 contains the red and green fluorescent materials 270 that change the wavelength of the light emitted from the light emitting element 210.

The light source preferably has a maximum emission wavelength (emission peak wavelength) of 485 nm or less, more preferably 480 nm or less, and still more preferably 460 nm or less. Although the lower limit of the maximum emission wavelength is not particularly limited, it is preferably 400 nm or more, and more preferably 440 nm or more. This enables efficient excitation of the red fluorescent material and the green fluorescent material, resulting in efficient use of visible light. Furthermore, using a light source having the wavelength range provides a light emitting device having high light emission intensity.

A nitride semiconductor light-emitting element is used as a light source. Using a nitride semiconductor light-emitting element as a light source achieves a highly efficient light emitting device that has high output linearity to the input and is resistant to mechanical impact and stable.

A nitride semiconductor light-emitting element that emits visible light in the short wavelength region may be used. As the semiconductor light-emitting elements of blue and green colors, for example, those using nitride semiconductors $(In_XAl_YGa_{1-X-Y}N, 0 \leq X, 0 \leq Y, X+Y \leq 1)$ can be employed.

As a red fluorescent material, any red fluorescent material may be used as long as it is an $Mn^{4+}$-activated red fluorescent material that has an excitation wavelength at least in the blue region of visible light and an emission peak wavelength of 610 nm to 670 nm, and an emission spectrum with a half bandwidth of 30 nm or less. To achieve high color purity, the red fluorescent material preferably has a sharp emission spectrum with a narrow half bandwidth. The red fluorescent material particularly preferably has an excitation wavelength of 400 nm to 485 nm, and a maximum emission wavelength of 610 nm to 660 nm, and an emission spectrum with a half bandwidth of 20 nm or less.

Suitable specific examples of such an $Mn^{4+}$-activated red fluorescent material include an $Mn^{4+}$-activated Mg fluorogermanate fluorescent material ($3.5MgO.0.5MgF_2.GeO_2$:$Mn^{4+}$), which is exemplified in "INORGANIC PHOSPHORS" p. 212 (SECTION 4: PHOSPHOR DATA 4.10 Miscellaneous Oxides) by William M. Yen and Marvin J. Weber, CRC PRESS, and an $M^1_2M^2F_6$:$Mn^{4+}$ ($M^1$=Li$^+$, Na$^+$, K$^+$, Rb$^+$, Cs$^+$, NH$_4^+$; $M^2$=Si, Ge, Sn, Ti, Zr) fluorescent material, which is exemplified in Journal of the Electrochemical Society: SOLID-STATE SCIENCE AND TECHNOLOGY, July 1973, p 942.

Examples of the red fluorescent material may also include nanocrystals and quantum dots. As for nanocrystals and quantum dots, the articles in Nikkei Electronics 2014.3.3 "Quantum dot display" pp. 53-59 may be referred to.

An $Mn^{4+}$-activated Mg fluorogermanate fluorescent material is efficiently excited by blue light in the range of 400 nm to 485 nm, exhibiting a sharp emission spectrum with a half bandwidth of 15 nm, a maximum emission wavelength of 658 nm, and deep red. An $M^1_2M^2F_6$:$Mn^{4+}$ fluorescent material is efficiently excited by blue light in the range of 400 nm to 485 nm, exhibiting a sharp emission spectrum with a half band width of 8 nm, an emission peak of 629 nm, and deep red. Such red fluorescent materials have good wavelength consistency with red color filters commonly used in liquid crystal display devices. Hence, using the light emitting device as a backlight of an image display device enables highly efficient emission of red light. Deep color as used herein means that the color reproduction area is wider when used in an image display device.

The red fluorescent material included in the light emitting device is preferably at least one material selected from the group consisting of $Mn^{4+}$-activated Mg fluorogermanate fluorescent materials, $M^1_2M^2F_6$:$Mn_{4+}$ ($M^1$=Li$^+$, Na$^+$, K$^+$, Rb$^+$, Cs$^+$, NH$_4^+$; $M^2$=Si, Ge, Sn, Ti, Zr) fluorescent materials, nanocrystals and quantum dots, more preferably an $M_1^2M^2F_6$:$Mn^{4+}$ ($M^1$=Li$^+$, Na$^+$, K$^+$, Rb$^+$, Cs$^+$, NH$_4^+$; $M^2$=Si, Ge, Sn, Ti, Zr) fluorescent material, and still more preferably a $M^1_2M^2F_6$:$Mn^{4+}$ ($M^1$=K$^+$; $M^2$=Si, Ge) fluorescent material to achieve high color purity. In the red fluorescent material having a composition represented by the formula: $M^1_2M^2_{1-a}Mn^{4+}_aF_6$, the $Mn^{4+}$-activated quantity preferably satisfies 0<a<0.2.

To achieve long-term reliability, the red fluorescent material also preferably has a chemical composition represented by formula (1), and has a surface region having a lower concentration of tetravalent manganese ions than that of the inner region.

$$M^1_2[M^2_{1-a}Mn^{4+}_aF_6] \quad (1)$$

wherein $M^1$ denotes a cation that contains at least K$^+$, and may further contain at least one cation selected from the group consisting of Li$^+$, Na$^+$, Rb$^+$, Cs$^+$ and NH$_4^+$; $M^2$ is at least one element selected from the group consisting of elements from Groups 4 and 14 of the periodic table, and "a" denotes a number satisfying 0<a<0.2.

$M^1$ in formula (1) is a cation that contains at least potassium (K$^+$), and that may further contain at least one cation selected from the group consisting of lithium (Li$^+$), sodium (Na$^+$), rubidium (Rb$^+$), cesium (Cs$^+$), and ammonium (NH$_4^+$). Although the content percentage of potassium in $M^1$ is not particularly limited, it is preferably 50 mol % or more, and more preferably 80 mol % or more.

$M^2$ in formula (1) is at least one element selected from the group consisting of elements from Groups 4 and 14 of the periodic table; $M^2$ is preferably at least one element selected from the group consisting of titanium (Ti), zirconium (Zr), hafnium (Hf), silicon (Si), germanium (Ge) and tin (Sn), more preferably silicon (Si) or silicon (Si) and germanium (Ge), and still more preferably is silicon (Si), or silicon (Si) and germanium (Ge) to achieve desirable light emitting properties.

When $M^2$ includes silicon (Si), or silicon (Si) and germanium (Ge), a part of at least one of Si and Ge may be substituted by at least one element selected from the group consisting of elements from Group 4 of the periodic table including Ti, Zr and Hf and elements from Group 14 of the periodic table including C and Sn. In that case, the total content percentage of Si and Ge in $M^2$ is not particularly limited. For example, it is preferably 50 mol % or more, and more preferably 80 mol % or more.

A red fluorescent material preferably includes an inner region formed in the $1^{st}$ step, and a surface region formed in the $2^{nd}$ and $3^{rd}$ steps or the $2^{nd}$ step to be described below, and having a lower concentration of tetravalent manganese ions than the inner region.

In the red fluorescent material, the concentration of tetravalent manganese ions in the surface region is lower than that in the inner region. The surface region may be clearly separated from the inner region like a two-layered structure with a clear interface between them. Alternatively, the surface region need not be separated from the inner region with a clear interface therebetween, and the concentration of tetravalent manganese ion may gradually lower from the inside of the surface region toward the outside.

On one hand, the red fluorescent material described below contributes, as $Mn^{4+}$-activated red fluorescent material particles as a whole, to the properties, i.e., higher white brightness and higher color purity of the image display device, compared with the light emitting device including conventional red fluorescent materials. On the other hand, even when the surface of the red fluorescent material elutes when humidity is high, less tetravalent manganese ion-derived carbon dioxide is generated, because little or no tetravalent manganese ions are present in the surface region. This reduces blackening of the red fluorescent material surface, thereby reducing decreases in light emitting intensity.

The average value of the concentration of tetravalent manganese ions present in the surface region of the red fluorescent material is preferably 30 mass % or less of the average value of the concentration of tetravalent manganese ions in the inner region. Furthermore, the concentration of tetravalent manganese ions present in the surface region is more preferably 25 mass % or less, and still more preferably 20 mass % or less of the concentration of tetravalent manganese ions in the inner region. On the other hand, the concentration of tetravalent manganese ions in the surface region may be 0.5 mass % or more of that of the inner region. As stated above, although nearing the concentration of tetravalent manganese ion to zero helps increase moisture-resistance, as the concentration of tetravalent manganese ions in the surface region decreases, the percentage of the region that does not contribute to the light emission would increase in the surface region of the fluoride fluorescent material particles.

Although the thickness of the surface region may vary depending on the particle size of red fluorescent material, it is preferably about ⅒ to ⅟₅₀ of the average particle size. For example, if the average particle size of the red fluorescent material as a whole is 20 μm to 40 μm, the thickness of the surface region is 2 μm or less.

The red fluorescent material is prepared such that the amount of the elution of the tetravalent manganese ions when the red fluorescent material is put into 1 to 5-fold mass pure water at 25° C., for example, is in the range of 0.05 ppm to 3 ppm. The elution of tetravalent manganese ions under these conditions is preferably in the range of 0.1 ppm to 2.5 ppm, and more preferably in the range of 0.2 ppm to 2.0 ppm. The lower the elution amount of the tetravalent manganese, the higher the moisture-resistance, but as the percentage of the surface region with little tetravalent manganese ion increases, the light emission intensity is likely to decrease, as stated above. The amount of the elution of the manganese ion is measured by: putting the red fluorescent material into pure water of 1 to 5-fold amount (preferably, 3-fold amount) in weight of the red fluorescent material, stirring at 25° C. for 1 hour, adding a reducing agent to cause the manganese ions to elute in the liquid, collecting the supernatant, and performing a quantitative analysis using an ICP (inductively coupled plasma) emission analyzer.

(Method for Manufacturing the Red Fluorescent Material)

The method for manufacturing the red fluorescent material having a chemical composition represented by formula (1) and including a surface region having a lower concentration of tetravalent manganese ions than that of the inner region, includes the $1^{st}$ step for forming the inner region (hereinafter also referred to as "core portion"), the $2^{nd}$ step and the $3^{rd}$ step for forming the surface region.

($1^{st}$ Step)

The method for manufacturing the red fluorescent material may further include the step of preparing a fluoride having a chemical composition represented by formula (1). The step of preparing a fluoride may include the step of manufacturing a fluoride having a chemical composition represented by formula (1).

The fluoride having a chemical composition represented by formula (1) may be produced by contacting in a liquid medium containing hydrogen fluoride, a first complex ion containing a tetravalent manganese ion, a cation that contains at least potassium ($K^+$), and may further contain at least one element selected from the group consisting of lithium ($Li^+$), sodium ($Na^+$), rubidium ($Rb^+$), cesium ($Cs^+$), and ammonium ($NH_4^+$), and a second complex ion containing at least one element selected from the group consisting of elements from Groups 4 and 14 of the periodic table.

A fluoride having a chemical composition represented by formula (1) may be produced, for example, by a manufacturing method including the step of mixing a solution "a" (Solution a) containing a first complex ion that contains tetravalent manganese, a second complex ion that contains at least one element selected from the group consisting of elements from Groups 4 and 14 of the periodic table and fluorine ion, and at least hydrogen fluoride, with a solution "b" (Solution b) containing a cation that contains at least $K^+$ and may further contain at least one cation selected from the group consisting of $Li^+$, $Na^+$, $Rb^+$, $Cs^+$ and $NH_4^+$, and at least hydrogen fluoride (hereinafter also referred to as "first fluoride manufacturing process").

(Solution a)

Solution a is a hydrofluoric acid solution containing a first complex ion containing tetravalent manganese and a second complex ion containing at least one element selected from the group consisting of elements from Groups 4 and 14 of the periodic table and fluorine ion.

The manganese source for forming a first complex ion containing tetravalent manganese is not particularly limited as long as it is a compound containing manganese. Specific examples of the manganese sources that can constitute Solution a include $K_2MnF_6$, $KMnO_4$, and $K_2MnCl_6$. In particular, $K_2MnF_6$ is preferable, mainly because it can stably present in hydrofluoric acid in the form of $MnF_6$ complex ions, while maintaining the oxidation number (tetravalent) to be activated. Of the manganese sources, those that contain at least $K^+$ and that may further contain at least one cation selected from the group consisting of $Li^+$, $Na^+$, $Rb^+$, $Cs^+$ and $NH_4^+$, can also serve as a cation source contained in the second solution described later. The manganese sources constituting the first solution may be used alone or in combination.

The concentration of the first complex ion in Solution a is not particularly limited. The lower limit of the ionic concentration of the first complex in Solution a is usually 0.01 mass % or more, preferably 0.03 mass % or more, and more preferably 0.05 mass % or more. The upper limit of the concentration of the first complex ion in Solution a is usually 50 mass % or less, preferably 40 mass % or less, and more preferably 30 mass % or less.

The second complex ion preferably contains at least one element selected from the group consisting of titanium (Ti), zirconium (Zr), hafnium (Hf), silicon (Si), germanium (Ge) and tin (Sn), more preferably contains silicon (Si), or silicon (Si) and germanium (Ge), and still more preferably, the second complex ion is a silicon fluoride complex ion.

When, for example, the second complex ion contains silicon (Si), the source of the second complex ion is preferably a compound that contains silicon and fluorine and that is highly soluble in the solution. Specific examples of the source of the second complex ions include $H_2SiF_6$, $Na_2SiF_6$, $(NH_4)_2SiF_6$, $Rb_2SiF_6$, and $Cs_2SiF_6$. Of these, $H_2SiF_6$ is preferable, because it is highly soluble in water, and contains no alkali metal element as an impurity. The sources of the second complex ions may be used alone or in combination.

The lower limit of the concentration of the source of the second complex ions in Solution a is usually 5 mass % or more, preferably 10 mass % or more, and more preferably 15 mass % or more. The upper limit of the concentration of the source of the second complex ions in Solution a is usually 80 mass % or less, preferably 70 mass % or less, and more preferably 60 mass % or less.

The lower limit of the concentration of hydrogen fluoride in Solution a is usually 20 mass % or more, preferably 25 mass % or more, and more preferably 30 mass % or more. The upper limit of the concentration of hydrogen fluoride in Solution a is usually 80 mass % or less, preferably 75 mass % or less, and more preferably 70 mass % or less.

(Solution b)

Solution b contains at least a cation that contains at least $K^+$ and may further contain at least one cation selected from the group consisting of $Li^+$, $Na^+$, $Rb^+$, $Cs^+$ and $NH_4^+$, and hydrogen fluoride, and may contain additional components as necessary. Solution b is obtained, for example, as an aqueous solution of hydrofluoric acid containing at least a cation that contains at least $K^+$ and may further contain at least one cation selected from the group consisting of $Li^+$, $Na^+$, $Rb^+$, $Cs^+$ and $NH_4^+$.

Specific examples of the potassium source containing a potassium cation capable of constituting Solution b include water-soluble potassium salts such as KF, $KHF_2$, KOH, KCl, KBr, KI, potassium acetate, and $K_2CO_3$. Of these, $KHF_2$ is preferable because it is soluble in the solution without reducing the concentration of hydrogen fluoride, and it has a low heat of dissolution and is highly safe.

Specific examples of the sodium source containing a sodium cation capable of constituting Solution b include water-soluble sodium salts such as NaF, $NaHF_2$, NaOH, NaCl, NaBr, NaI, sodium acetate, and $Na_2CO_3$.

Specific examples of the rubidium source containing a rubidium cation capable of constituting Solution b include water-soluble rubidium salts such as RbF, rubidium acetate, and $Rb_2CO_3$.

Specific examples of the cesium source containing a cesium cation capable of constituting Solution b include water-soluble cesium salts such as CsF, cesium acetate, and $Cs_2CO_3$.

Specific examples of the sodium source containing a quaternary ammonium cation capable of constituting Solution b include water-soluble ammonium salts such as $NH_4F$, ammonia water, $NH_4Cl$, $NH_4Br$, $NH_4I$, ammonium acetate, and $(NH_4)_2CO_3$. The ion sources constituting Solution b may be used alone or in combination.

The lower limit of the concentration of hydrogen fluoride in Solution b is usually 20 mass % or more, preferably 25 mass % or more, and more preferably 30 mass % or more. The upper limit of the concentration of hydrogen fluoride in Solution b is usually 80 mass % or less, preferably 75 mass % or less, and more preferably 70 mass % or less.

The lower limit of the concentration of cations in Solution b is usually 5 mass % or more, preferably 10 mass % or more, and more preferably 15 mass % or more. The upper limit of the concentration of cations in Solution b that contains at least $K^+$, and may further contain at least one selected from the group consisting of $Li^+$, $Na^+$, $Rb^+$, $Cs^+$, and $NH_4^+$ is usually 80 mass % or less, preferably 70 mass % or less, and more preferably 60 mass % or less.

The method of mixing Solutions a and b is not particularly limited. Solution a may be added while stirring Solution b, or Solution b may be added while stirring Solution a. Alternatively, Solutions a and b each may be charged into a container and mixed by stirring.

Mixing Solution a with Solution b allows the first complex ions, cations that contain at least $K^+$ and may further contain at least one cation selected from the group consisting of $Li^+$, $Na^+$, $Rb^+$, $Cs^+$ and $NH_4^+$, and the second complex ions to react with one another in predetermined proportions to precipitate as crystals of the desired fluoride. The precipitated crystals can be collected by solid-liquid separation through filtration, for example. The precipitated crystals may be washed with a solvent such as ethanol, isopropyl alcohol, water, and acetone. The crystals may then be dried usually at 50° C. or more, preferably at 55° C. or more, and more preferably at 60° C. or more, and usually at 110° C. or less, preferably at 100° C. or less, and more preferably at 90° C. or less. The drying time is not particularly limited as long as water remaining on the fluoride particles is vaporized, and it is 10 hours, for example.

In mixing Solution a with Solution b, it is preferable to suitably adjust the mixing ratio so as to obtain a product, or fluoride, having the intended chemical composition, considering the difference between the initial composition of Solution a and Solution b and the chemical composition of the resultant fluoride particles.

The fluoride having a chemical composition represented by formula (1) can also be produced by a production process comprising the step of mixing a first solution containing at least a first complex ion that contains a tetravalent manganese ion and hydrogen fluoride; a second solution containing at least a cation that contains at least $K^+$ and may further contain at least one cation selected from the group consisting of $Li^+$, $Na^+$, $Rb^+$, $Cs^+$ and $NH_4^+$ and hydrogen fluoride; and a third solution containing at least a second complex ion that contains at least a fluorine ion and at least one element selected from the group consisting of elements from Groups 4 and 14 of the periodic table (hereinafter also called "a second process for producing a fluoride").

By mixing the first solution, the second solution, and the third solution, fluoride particles having the desired composition and the desired weight median size, can be easily produced at high productivity.

(First Solution)

The first solution contain at least a first complex ion that contains a tetravalent manganese and hydrogen fluoride, and may contain other components as necessary. The first solution is obtained as, for example, an aqueous solution of hydrofluoric acid containing a tetravalent manganese source. The manganese source is not particularly limited as long as it is a compound containing manganese. Specific examples of the manganese sources that can constitute the first solution include $K_2MnF_6$, $KMnO_4$, and $K_2MnCl_6$. Of these, $K_2MnF_6$ is preferable, mainly because it can stably present in hydrofluoric acid in the form of $MnF_6$ complex ions, while maintaining the oxidation number (tetravalent) to be activated. Of the manganese sources, those containing cations that contain at least $K^+$ and may further contain at least one cation selected from the group consisting of $Li^+$, $Na^+$, $Rb^+$, $Cs^+$ and $NH_4^+$ may also serve as a cation source that contains at least $K^+$ and may further contain at least one cation selected from the group consisting of $Li^+$, $Na^+$, $Rb^+$, $Cs^+$ and $NH_4^+$ in the second solution. The manganese sources constituting the first solution may be used alone or in combination.

The lower limit of the concentration of hydrogen fluoride in the first solution is usually 20 mass % or more, preferably 25 mass % or more, and more preferably 30 mass % or more. The upper limit of the concentration of hydrogen fluoride in the first solution is usually 80 mass % or less, preferably 75 mass % or less, and more preferably 70 mass % or less. When the hydrogen fluoride concentration is 30 mass % or more, the manganese source (e.g., $K_2MnF_6$) constituting the first solution is more stable to hydrolysis, and the concentration of the tetravalent manganese in the first solution fluctuates less. This facilitates control of the amount of the manganese for activation that is contained in the fluoride fluorescent materials, and is likely to reduce in light emitting efficiency of the fluoride fluorescent materials. When the concentration of hydrogen fluoride is 70 mass % or less, decreases in the boiling point of the first solution can be prevented or reduced, and the generation of hydrogen fluoride gas may be avoided or reduced. This facilitates control of the concentration of hydrogen fluoride in the first solution, effectively reducing the variation in particle size of the resultant fluoride fluorescent materials.

The concentration of the first complex ion in the first solution is not particularly limited. The lower limit of the concentration of the first complex ion in the first solution is usually 0.01 mass % or more, preferably 0.03 mass % or more, and more preferably 0.05 mass % or more. The upper limit of the concentration of the first complex ion in the first solution is usually 50 mass % or less, preferably 40 mass % or less, and more preferably 30 mass % or less.

(Second Solution)

The second solution contains at least hydrogen fluoride and cations that contain at least $K^+$ and may further contain at least one cation selected from the group consisting of $Li^+$, $Na^+$, $Rb^+$, $Cs^+$ and $NH_4^+$, and may contain additional components as necessary. The second solution is obtained, for example, as an aqueous solution of hydrofluoric acid containing cations that contain at least $K^+$ and may further contain at least one cation selected from the group consisting of $Li^+$, $Na^+$, $Rb^+$, $Cs^+$ and $NH_4^+$. Specific examples of the ion sources containing ions that can constitute the second solution include water-soluble salts such as NaF, NaHF$_2$, NaOH, NaCl, NaBr, NaI, sodium acetate, Na$_2$CO$_3$, RbF, rubidium acetate, Rb$_2$CO$_3$, CsF, cesium acetate, Cs$_2$CO$_3$, NH$_4$F, ammonia water, NH$_4$Cl, NH$_4$Br, NH$_4$I, ammonium acetate, and (NH$_4$)$_2$CO$_3$, in addition to potassium-containing salts such as KF, KHF$_2$, KOH, KCl, KBr, KI, potassium acetate, and K$_2$CO$_3$. Of these, using at least KHF$_2$ is preferable, because it is soluble in the solution without decreasing the concentration of hydrogen fluoride, and it has a low heat of dissolution and is highly safe. Besides potassium, NaHF$_2$ is preferable as a source of the ions. The ion sources that constitute the second solution may be used alone or in combination.

The lower limit of the concentration of hydrogen fluoride in the second solution is usually 20 mass % or more, preferably 25 mass % or more, and more preferably 30 mass % or more. The upper limit of the concentration of hydrogen fluoride in the second solution is usually 80 mass % or less, preferably 75 mass % or less, and more preferably 70 mass % or less.

The lower limit of the ion concentration of the cations that contain at least K$^+$ and may further contain at least one cation selected from the group consisting of Li$^+$, Na$^+$, Rb$^+$, Cs$^+$ and NH$_4^+$ in the second solution is usually 5 mass % or more, preferably 10 mass % or more, and more preferably 15 mass % or more. The upper limit of the ion concentration of the cation that contains at least K$^+$ and may further contain at least one cation selected from the group consisting of Li$^+$, Na$^+$, Rb$^+$, Cs$^+$ and NH$_4^+$ in the second solution is usually 80 mass % or less, preferably 70 mass % or less, and more preferably 60 mass % or less.

(Third Solution)

The third solution contains at least the second complex ions containing fluorine ions and at least one element selected from the group consisting of elements from Groups 4 and 14 of the periodic table, and may contain additional components as necessary. The third solution can be obtained, for example, as an aqueous solution containing the second complex ions.

The second complex ions preferably contain at least one selected from the group consisting of titanium (Ti), zirconium (Zr), hafnium (Hf), silicon (Si), germanium (Ge), and tin (Sn), more preferably contain silicon (Si), or silicon (Si) and germanium (Ge), and, still more preferably, the second complex ions are silicon fluoride complex ions.

When the second complex ions contain, for example, silicon (Si), the source of the second complex ions preferably is a compound that contains silicon and fluorine, and is highly soluble in the solution. Specific examples of the source of the second complex ions includes H$_2$SiF$_6$, Na$_2$SiF$_6$, (NH$_4$)$_2$SiF$_6$, Rb$_2$SiF$_6$, and Cs$_2$SiF$_6$. Of these, H$_2$SiF$_6$ is preferable, because it is highly soluble in water and contains no alkali metal element as an impurity. The sources of the second complex ions constituting the third solution may be used alone or in combination.

The lower limit of the concentration of the second complex ions in the third solution is usually 5 mass % or more, preferably 10 mass % or more, and more preferably 15 mass % or more. The upper limit of the concentration of the second complex ions in the third solution is usually 80 mass % or less, preferably 70 mass % or less, and more preferably 60 mass % or less.

The method of mixing the first, second, and third solutions is not particularly limited. The second and third solutions may be added while the first solution is stirred, or the first and third solutions may be added while the second solution is stirred, or the first and second solutions may be added while the third solution is stirred. Alternatively, the first solution, the second solution and the third solution each may be charged into a container and then mixed by stirring.

Mixing the first, second and third solutions allows the first complex ions, cations that contain at least K$^+$ and may further contain at least one cation selected from the group consisting of Li$^+$, Na$^+$, Rb$^+$, Cs$^+$ and NH$_4^+$, and the second complex ions to react with one another in predetermined proportions to precipitate the desired fluoride crystals having a chemical composition represented by formula (1). The precipitated fluoride particles can be collected by solid-liquid separation through filtration, for example. The precipitated crystals may be washed with a solvent such as ethanol, isopropyl alcohol, water, and acetone. The precipitated crystals may further be dried, usually at 50° C. or more, preferably at 55° C. or more, and more preferably at 60° C. or more, and usually at 110° C. or less, preferably at 100° C. or less, and more preferably at 90° C. or less. The drying time is not particularly limited as long as water remaining on the fluoride particles is vaporized, and is 10 hours, for example.

In mixing the first, second and third solutions, it is preferable to suitably adjust the mixing ratio so as to obtain a product, or fluoride, having the intended composition, considering the difference between the initial composition of the first, second and third solutions, and the composition of the resultant fluoride.

($2^{nd}$ Step)

In the $2^{nd}$ step, a reducing agent is added to the dispersed substance containing fluoride particles that is obtained in the $1^{st}$ step. By adding a reducing agent, at least a part of the first complex ions contained in the dispersed substance is preferably reduced to divalent manganese ions. In the $2^{nd}$ step, 90 mol % or more of the first complex ions is preferably reduced, and 95 mol % or more is more preferably reduced.

The reducing agent is not particularly limited as long as it can reduce the first complex ions. Specific examples of the reducing agent include hydrogen peroxide and oxalic acid.

Of these, hydrogen peroxide is preferable, because it can reduce the first complex ions with little adverse effect on the fluoride particles, like dissolving the fluoride particles, and it eventually decomposes into water and oxygen, and thus can be advantageously used in the production process with reduced environmental burden.

The amount of the reducing agent is not particularly limited. The amount of the reducing agent can be suitably selected depending, for example, on the content of the first complex ions in the dispersed substance, preferably in such an amount that the concentration of hydrogen fluoride in the dispersed substance is not substantially affected. The specific amount of the reducing agent is preferably 3 equivalent % or more, and more preferably 5 equivalent % or more relative to the content of the first complex ions that are contained in the dispersed substance.

As used herein, one equivalent means the number of moles of the reducing agent that is required for reducing 1 mole of the first complex ions into divalent manganese ions.

The $2^{nd}$ step may include, after a reducing agent is added to the dispersed substance, the step of mixing them. The mixing means for mixing the dispersed substance and the reducing agent may be suitably selected from the conventional mixing means depending, for example, on the reaction container.

The temperature in the $2^{nd}$ step is not particularly limited. The reducing agent may be added in the temperature range of, for example, 15 to 40° C., and preferably in the temperature range of 23 to 28° C.

The atmosphere in the $2^{nd}$ step is not particularly limited. The reducing agent may be added in the ambient atmosphere, or in an inert gas atmosphere, such as nitrogen gas.

The reaction time in the $2^{nd}$ step is not particularly limited, and is, for example, 1 min to 30 min, and more preferably 3 min to 15 min.

($3^{rd}$ Step)

In the $3^{rd}$ step, a fluoride fluorescent material is obtained by contacting, in the presence of hydrogen fluoride, the second complex ions, and cations that contain at least $K^+$ and that may further contain at least one cation selected from the group consisting of $Li^+$, $Na^+$, $Rb^+$, $Cs^+$ and $NH_4^+$ with the fluoride particles in the dispersed substance to which a reducing agent is added. Contacting the fluoride particles with the second complex ions and cations that contain at least $K^+$ and that may further contain at least one cation selected from the group consisting of $Li^+$, $Na^+$, $Rb^+$, $Cs^+$ and $NH_4^+$, in the presence of hydrogen fluoride, causes precipitation of, for example, a fluoride containing at least one element selected from the group consisting of elements from Groups 4 and 14 of the periodic table, which is contained in the second complex ions, and cations that contain at least $K^+$ and that may further contain at least one cation selected from the group consisting of $Li^+$, $Na^+$, $Rb^+$, $Cs^+$ and $NH_4^+$, on the surfaces of the fluoride particles to give a desired fluoride fluorescent material.

The $3^{rd}$ step may be performed separately after the $2^{nd}$ step, or may be started after the start and before the completion of the $2^{nd}$ step and performed partly in parallel with the $2^{nd}$ step.

Because the fluoride fluorescent material obtained in the $3^{rd}$ step is produced by contacting fluoride particles represented by formula (1) with the second complex ion and cations that contain at least $K^+$ and that may further contain at least one selected from the group consisting of $Li^+$, $Na^+$, $Rb^+$, $Cs^+$ and $NH_4^+$, the resultant fluorescent material includes a surface region having a lower $Mn^{4+}$ concentration than the inner region. The surface region preferably has a composition represented by the following formula (2), wherein $M^1$ represents a cation that contains at least $K^+$ and that may further contain at least one selected from the group consisting of $Li^+$, $Na^+$, $Rb^+$, $Cs^+$ and $NH_4^+$; $M^2$ represents at least one element selected from the group consisting of elements from Groups 4 and 14 of the periodic table, and a satisfies $0<b<a$.

$$M^1_2[M^2_{1-b}Mn^{4+}_bF_6] \quad (2)$$

"a" and "b" are not particularly limited as long as $0<b<a$ is satisfied. The value of b may be suitably selected depending, for example, on the desired light emission properties and moisture resistance. The value of b can be controlled, for example, by adjusting the amount of contact of the second complex ions and cations that contain at least $K^+$ and that may further contain at least one selected from the group consisting of $Li^+$, $Na^+$, $Rb^+$, $Cs^+$ and $NH_4^+$ with fluoride particles in the $3^{rd}$ step.

The method of contacting fluoride particles in the dispersed substance to which a reducing agent is added with the second complex ions and cations that contain at least $K^+$ and that may further contain at least one cation selected from the group consisting of $Li^+$, $Na^+$, $Rb^+$, $Cs^+$ and $NH_4^+$ in the $3^{rd}$ step is not particularly limited. Mixing, for example, a dispersed substance to which a reducing agent is added with at least one of a solution containing cations that contain at least $K^+$ and that may further contain at least one cation selected from the group consisting of $Li^+$, $Na^+$, $Rb^+$, $Cs^+$ and $NH_4^+$ and a solution containing the second complex ions is preferable. Mixing a dispersed substance to which a reducing agent is added with at least one of the second solution and the third solution is more preferable, and mixing a dispersed substance to which a reducing agent is added with the second solution and the third solution is more preferable. Here, the preferred embodiments of the second solution and the third solution are as described above.

When a dispersed substance is mixed with at least one of a solution containing cations that contain at least $K^+$ and that may further contain at least one selected from the group consisting of $Li^+$, $Na^+$, $Rb^+$, $Cs^+$ and $NH_4^+$ and a solution containing the second complex ions, the other ions not contained in the solution to be mixed, specifically, either the cations that contain at least $K^+$ and that may further contain at least one selected from the group consisting of $Li^+$, $Na^+$, $Rb^+$, $Cs^+$ and $NH_4^+$ or the second complex ions, would suffice if contained in an amount necessary for the $3^{rd}$ step in the dispersed substance.

The second solution and the third solution in the $3^{rd}$ step may have the same or different compositions as or from the second solution and the third solution in the $1^{st}$ step, respectively.

When the $3^{rd}$ step includes mixing a dispersed substance to which a reducing agent is added with at least one of a solution containing cations that contain at least $K^+$ and that may further contain at least one selected from the group consisting of $Li^+$, $Na^+$, $Rb^+$, $Cs^+$ and $NH_4^+$ and a solution containing the second complex ions, the mixing means may be suitably selected from the conventional mixing means depending, for example, on the reaction container.

The temperature in the $3^{rd}$ step is not particularly limited. The step may be performed, for example, at a temperature in the range of 15 to 40° C., and preferably in the range of 23 to 28° C.

The atmosphere in the $3^{rd}$ step is also not particularly limited. The step may be performed in the ambient atmosphere or in an inert gas atmosphere, such as nitrogen gas.

The reaction time in the $3^{rd}$ step is not particularly limited, and is, for example, 1 min to 60 min, and more preferably 5 min to 30 min.

When the $3^{rd}$ step includes mixing a dispersed substance to which a reducing agent is added with at least one of a solution containing cations that contain at least $K^+$ and that may further contain at least one selected from the group consisting of $Li^+$, $Na^+$, $Rb^+$, $Cs^+$ and $NH_4^+$ and a solution containing the second complex ions, the amount of the solution containing the second complex ions and a solution containing cations that contain at least $K^+$ and that may further contain at least one selected from the group consisting of $Li^+$, $Na^+$, $Rb^+$, $Cs^+$ and $NH_4^+$ relative to the fluoride particles in the dispersed substance to which a reducing agent is added, may be appropriately selected, depending, for example, on the desired light emission properties and moisture resistance of the fluoride fluorescent materials. The amount of the second complex ions relative to the fluoride particles may be, for example, 1 mol % to 40 mol %, and preferably 5 mol % to 30 mol %.

The red fluorescent material having a chemical composition represented by formula (1) and having a surface region that has a lower concentration of tetravalent manganese ions than the inner region may be formed, after the $1^{st}$ step of forming the core portion, by a method including the $2^{nd}$ step, which is different from the $2^{nd}$ step and the $3^{rd}$ step.

(2nd step)

In the 2nd step, the fluoride particles obtained in the 1st step are put into an aqueous solution containing alkaline-earth metal ions and a reducing agent. Putting the fluoride particles into the aqueous solution containing alkaline-earth metal ions initiates a dissolution reaction of the fluoride particles, generating metal ions and fluorine ions constituting fluoride particles. The fluorine ions then react with alkaline-earth metal ions, generating an alkaline-earth metal fluoride on the surface of the fluoride particles, thereby forming a surface region having a lower concentration of tetravalent manganese ions than the inner region.

The alkaline-earth metal fluoride formed on the surface region of the red fluorescent material can suppress further dissolution reaction of the fluoride particles. Furthermore, the tetravalent manganese ions are reduced to divalent manganese ions because of the presence of the reducing agent. This suppresses generation of manganese dioxide.

Because alkaline-earth metal fluoride is formed on the surface of the fluoride fluorescent material and the generation of manganese dioxide on the surface is suppressed, the red-light fluorescent material has a high light emitting intensity, and the lowering of emission output and the generation of chromaticity change are reduced for an extended period of time. These are considered to be contributing to long-term reliability of the product.

The solution containing alkaline-earth metal ions contains at least alkaline-earth metal ions, counterions, and water. Examples of the alkaline-earth metal ions include magnesium (Mg) ions, calcium (Ca) ions, and strontium (Sr) ions.

Of these, to reduce chromaticity change and lowering of the emission output and to improve moisture resistance, the alkaline-earth metal ions preferably contain calcium ions.

The solution containing alkaline-earth metal ions is obtained as an aqueous solution of a compound containing an alkaline-earth metal, and may contain another component as necessary (e.g., alcohols such as methanol and ethanol). Examples of compounds containing alkaline-earth metal include nitrate (e.g., $Mg(NO_3)_2$, $Ca(NO_3)_2$, $Sr(NO_3)_2$), acetate (e.g., $Mg(CH_3CO_2)_2$, $Ca(CH_3CO_2)_2$, $Sr(CH_3CO_2)_2$), chloride (e.g., $MgCl_2$, $CaCl_2$, $SrCl_2$), iodide (e.g., $MgI_2$, $CaI_2$, $SrI_2$), and bromide (e.g., $MgBr_2$, $CaBr_2$, $SrBr_2$) of an alkaline-earth metal.

The compounds containing alkaline-earth metal may be used alone or in combination.

The concentration of the alkaline-earth metal in a solution containing alkaline-earth metal ions is not particularly limited. The lower limit of the concentration of the alkaline-earth metal ions in a solution containing an alkaline-earth metal is, for example, 0.01 mass % or more, preferably 0.03 mass % or more, and more preferably 0.05 mass % or more. The upper limit of the concentration of the alkaline-earth metal in a solution containing the alkaline-earth metal ions is, for example, 5 mass % or less, preferably 3 mass % or less, and more preferably 2 mass % or less.

The amount of the solution containing alkaline-earth metal ions is preferably 100 to 3000 parts by mass and more preferably 200 to 2000 parts by mass relative to 100 parts by mass of the fluoride particles. A solution containing such an amount of alkaline-earth metal ions further improves moisture resistance of the product.

Because of the presence of the reducing agent, at least a portion of the tetravalent manganese ions generated by the reaction between the fluoride particles and the solution containing alkaline-earth metal ions is reduced to divalent manganese ions. Specifically, preferably 90 mol % or more, and more preferably 95 mol % or more of the tetravalent manganese ions, which are generated by the reaction between the fluoride particles and the solution containing alkaline-earth metal ions, are reduced by the addition of the reducing agent.

The reducing agent is not particularly limited as long as it can reduce tetravalent manganese ions. Specific examples of the reducing agent include hydrogen peroxide and oxalic acid. Of these, hydrogen peroxide is preferable because it can reduce manganese without adverse effects on the fluoride particles or the mother body, like dissolving the fluoride particles, and it eventually discomposes into water and oxygen, and thus can be advantageously used in the production process with less environmental burden.

The amount of the reducing agent is not particularly limited. The amount of the reducing agent can be suitably selected depending, for example, on the content of manganese contained in fluoride particles, preferably in an amount that does not adversely affect the fluoride particles or the mother body. The specific amount of the reducing agent is preferably 1 equivalent % or more, and more preferably 3 equivalent % or more relative to the content of the manganese contained in the fluoride particles.

Here, one equivalent means the number of moles of the reducing agent that is required for reducing 1 mole of tetravalent manganese ions into divalent manganese ions.

The lower limit of the concentration of the reducing agent is, for example, 0.01 mass % or more, preferably 0.03 mass % or more, and more preferably 0.05 mass % or more in the solution containing alkaline-earth metal ions. The upper limit of the concentration of the reducing agent is, for example, 5 mass % or less, preferably 3 mass % or less, and more preferably 2 mass % or less in the solution containing alkaline-earth metal ions.

The method of contacting fluoride particles with a solution containing alkaline-earth metal ions in the presence of a reducing agent is not particularly limited. Examples of the method include mixing a reducing agent, fluoride particles, and a solution containing alkaline-earth metal ions.

The contacting time between fluoride particles with a solution containing alkaline-earth metal ions in the presence of a reducing agent, is not particularly limited as long as an alkaline-earth metal fluoride is formed on the surface of fluoride particles. The time may be, for example, 10 min to 10 hours, and preferably 30 min to 5 hours.

The temperature at the time of mixing a reducing agent, fluoride particles, and a solution containing alkaline-earth metal ions is not particularly limited. The mixing may be performed, for example, at a temperature in the range of 15 to 40° C., and preferably at a temperature in the range of 23 to 28° C.

The atmosphere at the time of mixing is also not particularly limited. Mixing may be performed in the ambient atmosphere, or in an inert gas atmosphere, such as nitrogen gas.

[Other Steps]

The method for manufacturing the red fluorescent material may further include other steps as necessary. The generated red fluorescent material can be collected by solid-liquid separation through filtration, for example. Further, the generated red fluorescent material may be washed with a solvent such as ethanol, isopropyl alcohol, water, and acetone. The generated red fluorescent material may then be dried, for example, at 50° C. or more, preferably at 55° C. or more, and more preferably at 60° C. or more, and, for example, at 110° C. or less, preferably at 100° C. or less, and more preferably at 90° C. or less. The drying time is not particularly limited as long as water remaining on the fluoride particles is vaporized, and it may be 10 hours, for example.

The amount of the red fluorescent material contained in the light emitting device is not particularly limited, and may be appropriately selected depending on, for example, the type of the red fluorescent material. The amount of the red fluorescent material is, for example, 10 to 90 parts by mass, and is preferably 5 to 40 parts by mass relative to 100 parts by mass of the encapsulation resin.

The light emitting device includes, in addition to the red fluorescent material, a green fluorescent material. The green fluorescent material is preferably a green fluorescent material that is excited by light emitted from the light source and emits green light having a maximum emission wavelength in the wavelength range of 510 nm to 550 nm. The green fluorescent material having a maximum emission wavelength in the above-mentioned range has a favorable wavelength consistency with color filters, increases brightness, and is likely to further broaden the range green color is reproduced.

The half bandwidth of the emission spectrum of the green fluorescent material is preferably 100 nm or less, and more preferably 80 nm or less because this range enables the image display device including the light emitting device to exhibit deeper green.

Examples of such a green fluorescent material include europium (Eu)-activated chloro silicate fluorescent materials represented by the compositional formula: $M^{11}{}_8MgSi_4O_{16}X^{11}$:Eu ($M^{11}$=Ca, Sr, Ba, Zn; $X^{11}$=F, Cl, Br, I); Eu-activated silcate fluorescent materials represented by $M^{12}{}_2SiO_4$:Eu ($M^{12}$=Mg, Ca, Sr, Ba, Zn); Eu-activated β sialon fluorescent materials represented by $Si_{6-z}Al_zO_zN_{8-z}$:Eu (0<z≤4.2); Eu-activated thiogallate fluorescent materials represented by $M^{13}Ga_2S_4$:Eu ($M^{13}$=Mg, Ca, Sr, Ba); rare-earth aluminate fluorescent materials represented by $(Y,Lu)_3(Al,Ga)_5O_{12}$:Ce, lanthanum silicon nitride-based fluorescent materials represented by, for example, $La_3Si_6N_{11}$:Ce, nanocrystals, and quantum dots. Of these, in view of the color reproduction range, the green fluorescent material is at least one material selected from the group consisting of Eu-activated chloro silicate fluorescent materials, Eu-activated silicate fluorescent materials, Eu-activated β sialon fluorescent materials, Eu-activated thiogallate fluorescent materials, rare-earth aluminate fluorescent materials, lanthanum silicon nitride-based fluorescent materials, nanocrystals and quantum dots, and more preferably at least one material selected from the group consisting of Eu-activated chloro silicate fluorescent materials, Eu-activated silicate fluorescent materials, Eu-activated β sialon fluorescent materials, Eu-activated thiogallate fluorescent materials and rare-earth aluminate fluorescent materials, and the green fluorescent material is still more preferably an Eu-activated β sialon fluorescent material.

Regarding the Eu-activated β sialon fluorescent material, preferred are those in which the emission spectrum has a narrow half-band width and the maximum emission wavelength is short like those described in International Publication WO 2007/066733.

The amount of the green fluorescent material contained in the light emitting device is not particularly limited, and may be appropriately selected depending on, for example, the type of the green fluorescent material. The amount of the green fluorescent material is, for example, 0 to 200 parts by mass, and preferably 0 to 200 parts by mass relative to 100 parts by mass of the encapsulation resin.

When the light emitting device is formed by encapsulating a nitride semiconductor light-emitting element, as a light source, with an encapsulation resin containing a red fluorescent material and a green fluorescent material, the encapsulation resin may be appropriately selected from conventional encapsulation resins. Specific examples of the encapsulation resins include silicone resins, modified silicone resins, epoxy resins, modified epoxy resins, and acrylic resins.

The method of manufacturing a light emitting device is not particularly limited, and the light emitting device may be manufactured by conventional methods.

The light emitting device according to the present embodiment includes a nitride semiconductor light-emitting element, as a light source, having an emission peak wavelength in the wavelength range of 240 nm to 560 nm; an $Mn^{4+}$-activated red fluorescent material having a maximum excitation wavelength within the emission spectrum range of the light source, an emission peak wavelength of 610 nm to 670 nm, and an emission spectrum with a half band width of 30 nm or less; and a green fluorescent material having an emission peak wavelength in the wavelength range of 510 nm to 550 nm. To achieve high white brightness and color purity of the image display, any of the following embodiments is preferable.

(1) A light emitting device wherein the light source is a nitride semiconductor light-emitting element having an emission peak wavelength in the wavelength range of 240 nm to 560 nm; the red fluorescent material has a maximum excitation wavelength within the range of the emission wavelength of the light source, an emission peak wavelength of 610 nm to 670 nm, and a half bandwidth of the emission spectrum of 30 nm or less; and the green fluorescent material is an Eu-activated fluorescent material.

(2) A light emitting device wherein the light source is a nitride semiconductor light-emitting element having an emission peak wavelength in the wavelength range of 240 nm to 560 nm; the red fluorescent material is at least one fluoride fluorescent material selected from the group consisting of $Mn^{4+}$-activated Mg fluorogermanate fluorescent materials, $M^1{}_2M^2F_6$:$Mn^{4+}$ ($M^1$=Li$^+$, Na$^+$, K$^+$, Rb$^+$, Cs$^+$, NH$_4^+$; Ge, Sn, Ti, Zr) fluorescent materials, nanocrystals, and quantum dots; and the green fluorescent material is at least one fluoride fluorescent material selected from the group consisting of Eu-activated chloro silicate fluorescent materials, Eu-activated silicate fluorescent materials, Eu-activated β sialon fluorescent materials, Eu-activated thiogallate fluorescent materials, rare-earth aluminate fluorescent materials represented by $(Y,Gd,Lu,Tb)_3(Al,Ga)_5O_{12}$:Ce, lanthanum silicon nitride-based fluorescent materials represented by, for example, $La_3Si_6N_{11}$:Ce, nanocrystals and quantum dots.

(3) A light emitting device wherein the light source is a nitride semiconductor light-emitting element having an emission peak wavelength in the wavelength range of 240 nm to 560 nm; the red fluorescent material is at least one fluoride fluorescent material selected from the group consisting of $Mn^{4+}$-activated Mg fluorogermanate fluorescent materials and $M^1{}_2M^2F_6$:$Mn^{4+}$ ($M^1$=Li$^+$, Na$^+$, K$^+$, Rb$^+$, Cs$^+$, NH$_4^+$; $M^2$=Si, Ge, Sn, Ti, Zr) fluorescent materials; and the green fluorescent material is at least one activated fluorescent material selected from the group consisting of Eu-activated chloro silicate fluorescent materials, Eu-activated silicate fluorescent materials, Eu-activated β sialon fluorescent materials, Eu-activated thiogallate fluorescent materials, rare-earth aluminate fluorescent materials represented by $(Y,Gd,Lu,Tb)_3(Al,Ga)_5O_{12}:Ce$, and lanthanum silicon nitride-based fluorescent materials represented by, for example, $La_3Si_6N_{11}:Ce$.

(4) A light emitting device wherein the light source is a nitride semiconductor light-emitting element having an emission peak wavelength in the wavelength range of 240 nm to 560 nm; the red fluorescent material is a fluorescent material represented by $M^1{}_2M^2F_6:Mn^{4+}$ ($M^1=K$; $M^2=Si$, Ge); and the green fluorescent material is an Eu-activated β sialon fluorescent material represented by $M^{12}{}_2SiO_4:Eu$ ($M^{12}$=ca, Sr, Ba, Zn).

(5) A light emitting device wherein the light source is a nitride semiconductor light-emitting element having an emission peak wavelength in the wavelength range of 240 nm to 560 nm; the red fluorescent material has a chemical composition represented by $M^1{}_2M^2F_6:Mn^{4+}$ ($M^1=K$; $M^2=Si$, Ge) and a surface region having a lower concentration of tetravalent manganese ions than the inner region; and the green fluorescent material is an Eu-activated β sialon fluorescent material represented by $Si_{6-z}Al_zO_zN_{8-z}:Eu$ ($0<z\leq4.2$).

(6) A light emitting device wherein the light source is a nitride semiconductor light-emitting element having an emission peak wavelength in the wavelength range of 240 nm to 560 nm, and the fluorescent material other than those described above may be light emitting substances called, for example, nanocrystals and quantum dots. Examples of these materials include semiconductor materials including Group II-VI, Group III-V, and Group IV-VI semiconductors. Specific examples include highly dispersed nanosized particles of ZnS, CdS, CdSe, $InAgS_2$, $InCuS_2$, core-shell $CdS_xSe_{1-x}$/ZnS, and GaP. Examples include InP, InAs, InAsP, InGaP, ZnTe, ZnSeTe, ZnSnP, and $ZnSnP_2$.

<Image Display Device>

The image display device includes an image display module according to the present embodiment. The image display device may further include, for example, a light transmittance controlling member (e.g., liquid crystals) in addition to the image display module, which includes a light emitting device and a color filter.

The image display device including the image display module achieves both white brightness and color purity at a high level.

In the image display device, when the emission peak wavelength of the light source in the light emitting device changes in the range of 440 nm to 455 nm, the amounts of change, Δx and Δy, in the white point within the region surrounded by the four points with the coordinates (x, y): (0.2400, 0.2000), (0.2400, 0.3000), (0.3000, 0.3000), and (0.3000, 0.2000) (hereinafter also referred to as "specific chromaticity region") in the CIE1931 chromaticity diagram, are both preferably 0.001 or less.

That is, regarding a chromaticity coordinate value (x, y) contained in the specific chromaticity region that appears when the emission peak wavelength of the light source is a specific wavelength (e.g., 440 nm) in the range of 440 nm to 455 nm, if the light source is changed to another light source having a different emission peak wavelength (e.g., 455 nm) in the range of 440 nm to 455 nm, the amounts of change, Δx and Δy, of the chromaticity coordinate value are both preferably 0.001 or less. This indicates that even if the emission peak wavelength of a light source included in the light emitting device varies in the range of 440 nm to 455 nm due to, for example, some variations in the manufacturing process, the chromaticity coordinate value of the white point varies little.

A specific structure of the image display device according to the present embodiment will be explained below.

FIG. 4 is a schematic sectional view showing an example of the image display device according to the present embodiment. As shown in FIG. 4, the image display device 100 according to the present embodiment includes a liquid crystal cell member 10 including a color filter 4 that includes a transparent substrate 1; colored pixels 2 consisting of a red pixel 2R, a green pixel 2G, and a blue pixel 2B formed on the transparent substrate 1; light shielding portions 3 formed between pixels 2R, 2G, and 2B and defining the pixels 2; an opposing substrate 5; and a liquid crystal layer 6 formed between the color filter 4 and an opposing substrate 5; a semiconductor light-emitting element, and a backlight member 20 including a light emitting device 21 that includes a red fluorescent material and a green fluorescent material and a light-guiding panel 22. In addition, on the surfaces of the liquid crystal cell member, polarizing plates 30A and 30B are usually arranged.

The backlight member 20 according to the present embodiment is not particularly limited as long as it includes the above-described light emitting device, and necessary structural components therefor may be appropriately selected. Such structural components include an optical element such as a light-guiding panel, a light diffusion sheet, and a prism sheet; and a mounting board for mounting the light emitting device.

As a light-guiding panel, those used for conventional light emitting devices may be used. The light-guiding panel is formed by injection molding using an acrylic resin and an epoxy resin as a material in consideration of translucency and mechanical strength. Each side of the light-guiding panel may be provided with surface asperities in consideration of extraction of light.

As the light diffusion sheet and prism sheet, those for conventional backlights may be used, and the description of them is omitted here.

As the mounting board, those for conventional light emitting devices may be used, and suitable examples include an insulating plate, like a plate made of a glass epoxy resin, provided with a wiring pattern by copper-, silver-, and gold-plating. The mounting board may be a flexible substrate. The mounting board usually has electrode terminals for the connection with external electrodes.

The light emitting device is connected with the wiring pattern on the mounting board by soldering or with a conductive material such as a silver paste.

Figure 5:
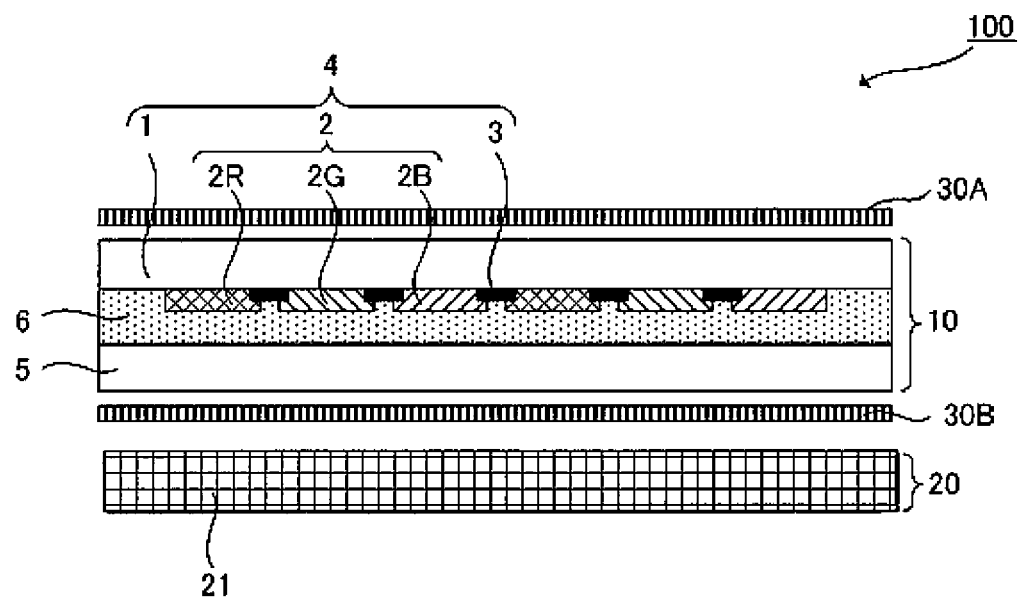
FIG. 5 is a schematic sectional view showing another structural example of an image display device according to the present embodiment.

The backlight member in the present embodiment may have a structure in which the light emitting device 21 is disposed on an end face of the light-guiding panel 22 as shown in FIG. 4, or in which the light emitting device 21 is disposed across the entire surface of the light-guiding panel 22 such that an optical element, such as a polarizing plate 30B, is interposed between the light emitting device and the liquid crystal cell member 10, as shown in FIG. 5. The latter configuration is called "right-under type".

EXAMPLES

The present invention will be specifically described below with reference to the Examples, but the present invention is by no means limited to these Examples.

Production Example 1

21.66 g of $K_2MnF_6$ was weighed and was dissolved in 800 g of an aqueous solution of 55 mass % HF. To this, 400 g of an aqueous solution of 40 mass % $H_2SiF_6$ was added to prepare a solution A (Solution A) such that Solution A has the initial composition ratio as shown in Table 1. In addition, 260.14 g of $KHF_2$ was weighed and dissolved in 450 g of an aqueous solution of 55 mass % HF to prepare a solution B (Solution B). In addition, 200 g of an aqueous solution of 40 mass % $H_2SiF_6$ was weighed to be used as a solution C (Solution C).

Next, Solution B and Solution C were simultaneously added dropwise to Solution A while being stirred at room temperature (23 to 28° C.), thereby causing crystals of a fluorescent material (fluoride particles) to precipitate, and the dropwise addition was suspended when the addition of 75 mass % each of Solutions B and C was completed (the $1^{st}$ step) as shown in Table 2.

15 g of an aqueous solution of 30 mass % $H_2O_2$, as a reducing agent, was weighed and added to Solution A (the $2^{nd}$ step), and then the dropwise addition of Solutions B and C was restarted (the $3^{rd}$ step). After completion of the dropwise addition of Solutions B and C, the resultant precipitate was isolated and washed with IPA (isopropyl alcohol), and dried at 70° C. for 10 hours to prepare a red fluorescent material ($K_2[Si_{0.97}Mn^{4+}_{0.03}F_6]$) of Production Example 1.

main material) integrally formed with a lead frame. A semiconductor light-emitting element was adhered to the bottom surface of the recess of the compact using a phenylsilicone resin as an adhesive, and a pair of negative and positive electrodes of the semiconductor light-emitting element was each connected to a lead frame with a gold wire. Next, a curable resin product as an encapsulating member of the following composition was filled into the recess of the compact, and cured to form an encapsulating member.

Figure 2:
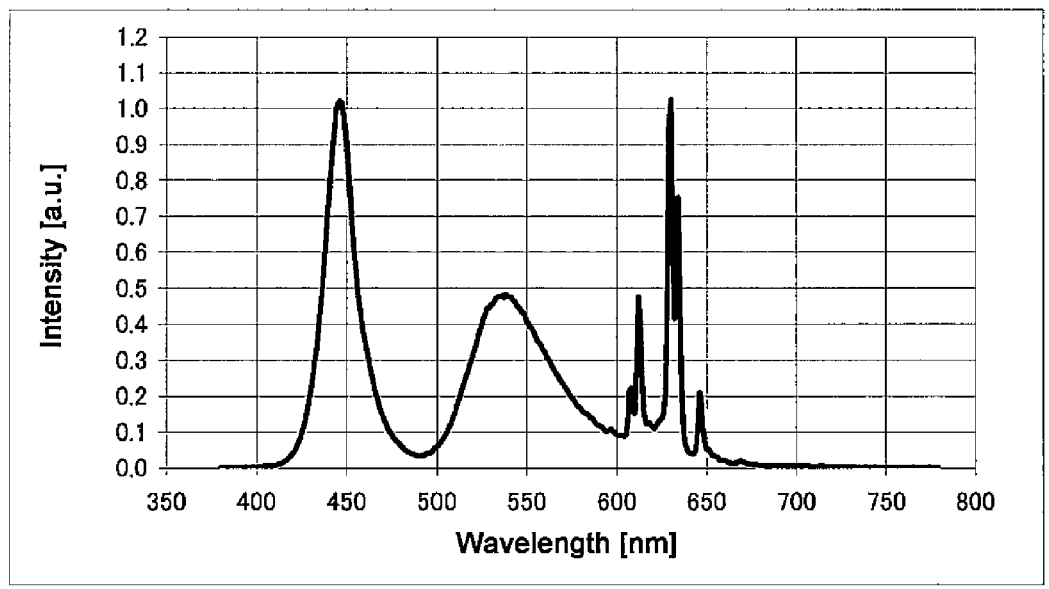
FIG. 2 is a graph showing an example of an emission spectrum of a light emitting device according to the present embodiment.

FIG. 2 is a graph showing the emission spectrum of a light emitting device according to the present Example. As shown in FIG. 2, the emission spectrum of the light emitting device according to the present Example is a synthesized emission spectrum of the emission spectrum of a gallium nitride semiconductor light-emitting element having an emission peak wavelength of 451 nm, the emission spectrum of β sialon, or a green fluorescent material, having an emission peak wavelength of 540 nm and a half bandwidth of 60 nm or less, and the emission spectrum of a red fluorescent material of Production Example 1 having an emission peak wavelength of 629 nm and a half bandwidth of 4 nm or less.

(Fabrication of Color Filter 1)

Color Filter 1 (CF-1) was prepared as follows:
(Preparation of Curable Resin Composition)

63 parts by mass of methyl methacrylate (MMA), 12 parts by mass of acryl acid (AA), 6 parts by mass of 2-hydroxyethyl methacrylate (HEMA), and 88 parts by mass of diethylene glycol dimethyl ether (DMDG) were charged into a polymerization tank, and the mixture was stirred and dissolved. To the mixture, 7 parts by mass of 2,2'-azobis(2-

TABLE 1

| | Initial Composition ratio (mol) | | | | Solution A Initial amount (g) | | | Solution B Initial amount (g) | | Solution C Initial amount (g) | Reducing agent (g) |
|---|---|---|---|---|---|---|---|---|---|---|---|
| | | | | | Aqueous 40% | Aqueous 55% | | | Aqueous 55% | Aqueous 40% | Aqueous 30% |
| | K | Si | Mn | F | $K_2MnF_6$ | $H_2SiF_6$ | HF | $KHF_2$ | HF | $H_2SiF_6$ | $H_2O_2$ |
| Production Example 1 | 2 | 0.95 | 0.05 | 6 | 21.66 | 400 | 800 | 260.14 | 450 | 200 | 15 |

TABLE 2

| | Dropwise percentage (%) before addition of reducing agent | |
|---|---|---|
| | Solution B | Solution C |
| Production Example 1 | 75 | 75 |

Example 1

(Preparation of Light Emitting Device 1)

72 parts by mass of the fluoride fluorescent material of Production Example 1 and 28 parts by mass of β sialon, which is a green fluorescent material, were dispersed in 100 parts by mass of a silicone resin to prepare an encapsulating material. A gallium nitride semiconductor light-emitting element having an emission peak wavelength of 451 nm was encapsulated with the encapsulating material to prepare a Light Emitting Device 1.

A resin compact, or a molded body, containing titanium oxide and an epoxy resin and having a recess was used as a compact. The compact used was a silver-plated copper (as a methylbutyronitrile) was added and dissolved homogenously. Subsequently, under a nitrogen atmosphere, the mixture was stirred at 85° C. for 2 hours, and further allowed to react at 100° C. for 1 hour. To the resultant solution, 7 parts by mass of glycidyl methacrylate (GMA), 0.4 parts by mass of triethylamine, and 0.2 parts by mass of hydroquinone were further added, and stirred at 100° C. for 5 hours to obtain a copolymer resin solution (solid content 50%).

Next, the following materials were stirred and mixed at room temperature to obtain a curable resin composition.

<Composition of Curable Resin Composition>

The above-described copolymer resin solution (solid content 50%): 16 parts by mass Dipentaerythritol pentaacrylate (SR399 by Sartomer): 24 parts by mass Ortho-cresol novolac epoxy resin (Epikote 180570 by YUKA SHELL EPDXY KABUSHIKI KAISHA): 4 parts by mass 2-Methyl-1-(4-methylthiophenyl)-2-morpholino propan-1-one: 4 parts by mass Diethylene glycol dimethyl ether: 52 parts by mass Formation of Black Matrix First, the components in the following quantities were mixed, and fully dispersed with a sand mill to prepare a black pigment dispersion.
<Composition of Black Pigment Dispersion>
Black pigment: 23 parts by mass
Polymer dispersant (Disperbyk 111 by BYK-Chemie Japan KK): 2 parts by mass
Solvent (Diethylene glycol dimethyl ether): 75 parts by mass Next, the components in the following quantities were fully mixed to obtain a composition for a light shielding layer.
<Composition of the Composition for a Light Shielding Layer>
The above-described black pigment dispersion: 61 parts by mass
Curable Resin Composition: 20 parts by mass
Diethylene glycol dimethyl ether: 30 parts by mass The above-described composition for a light shielding layer was spin-coated on a glass substrate (AN100 by Asahi Glass Co., Ltd.) having a thickness of 0.7 mm and dried at 100° C. for 3 min to form a light shielding layer having a film thickness of about 1 μm. The light shielding layer was exposed to light from an ultra-high pressure mercury lamp to form a light shielding pattern. Subsequently, the pattern was developed in an aqueous solution of 0.05 mass % potassium hydroxide, and then the substrate was left to stand at a temperature of 180° C. for 30 min so as to undergo heating treatment to form a black matrix in regions where light shielding portions are to be formed.

(Formation of Colored Layer)
Onto the substrate with the thus formed black matrix, a red curable resin composition having the following composition was spin-coated, followed by drying in an oven at 70° C. for 3 min. Subsequently, a photomask was disposed at a distance of 100 μm from the coated film of the red curable resin composition, and only the region for forming a colored layer was irradiated with ultraviolet light from an ultra-high pressure mercury lamp of 2.0 kW for 10 seconds in a proximity aligner. Subsequently, the substrate was immersed in an aqueous solution of 0.05 mass % potassium hydroxide (liquid temperature: 23° C.) for 1 min for alkaline-development so as to remove only the uncured portions of the coated film of the red curable resin composition. The substrate was thereafter left to stand at a temperature of 180° C. for 30 min so as to undergo heating treatment to form a red relief pattern in the region where the red pixels are to be formed (thickness: 2.0 μm).

Next, using a green curable resin composition having the following composition, a green relief pattern was formed in the region where green pixels are to be formed through the same process as the formation of the red relief pattern.

Furthermore, using a blue curable resin composition having the following composition, a blue relief pattern was formed in the region where blue pixels are to be formed through the same process as the formation of the red relief pattern, so as to form a colored layer with three colors, red (R), green (G), and blue (B).

(Preparation of Blue Colorant 1)

15.2 g (60 mmol) of 1-naphthyl iodide by Wako Pure Chemical Industries, Ltd., 4.63 g (30 mmol) of norbornane diamine (NBDA) (CAS No. 56602-77-8) by Mitsui Chemicals, Inc., 8.07 g (84 mmol) of sodium-tert-butoxide, 0.09 g (0.2 mmol) of 2-dicyclohexyl phosphino-2',6'-dimethoxy biphenyl by Aldrichi, and 0.021 g (0.1 mmol) of palladium acetate by Wako Pure Chemical Industries, Ltd. were dispersed in 30 mL of xylene, and allowed to react at 130° C. to 135° C. for 48 hours. After completion of the reaction, the mixture was cooled to room temperature, and to this, water was added and extraction was performed. Subsequently, the extracted product was dried and concentrated with magnesium sulfate to obtain 8.5 g (yield: 70%) of an intermediate 1 (Intermediate 1) represented by formula (A). The resultant compound was identified to be the target compound according to the analysis results shown below.

MS(ESI) (m/z): 407 (M+H),

Elemental analysis value: CHN Found (85.47%, 8.02%, 6.72%); Calculated: (85.26%, 8.11%, 6.63%)

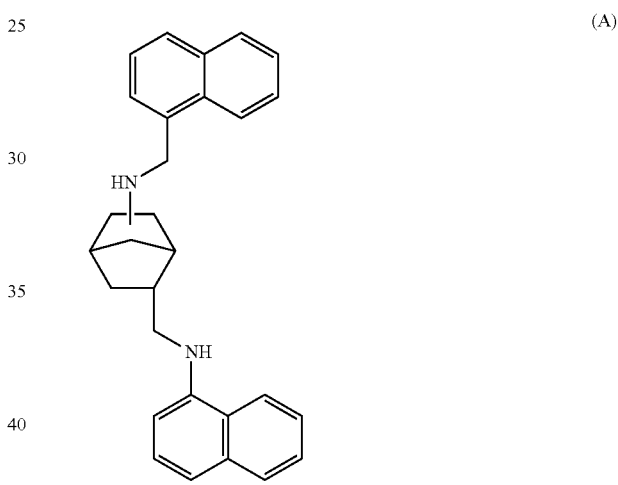

(A)

8.46 g (20.8 mmol) of Intermediate 1, 13.5 g (41.6 mmol) of 4,4'-bis(diethylamino)benzophenone by Tokyo Chemical Industry Co., Ltd., and 60 mL of toluene were charged and stirred at 45° C. to 50° C. 6.38 g (51.5 mmol) of phosphorus oxychloride by Wako Pure Chemical Industries, Ltd. was added dropwise, and the mixture was refluxed for 2 hours and cooled. After completion of the reaction, toluene was decanted. To the resultant resinous precipitate, 40 mL of chloroform, 40 mL of water, and concentrated hydrochloric acid were added to dissolve the precipitate and the chloroform layer was separated. The chloroform layer was washed with water, dried with magnesium sulfate, and concentrated. To the concentrate, 65 mL of ethyl acetate was added and refluxed. After cooling, the precipitate was filtered to yield 15.9 g (yield: 70%) of a blue colorant 1 (Blue Colorant 1) (BB7-Nb-dimer) represented by the following chemical formula (B).

The resultant compound was identified as the targeted compound according to the following analysis results.

MS(ESI) (m/z): 511(+), divalent elemental analysis value: CHN Found (78.13%, 7.48%, 7.78%); Calculated: (78.06%, 7.75%, 7.69%)

(B)

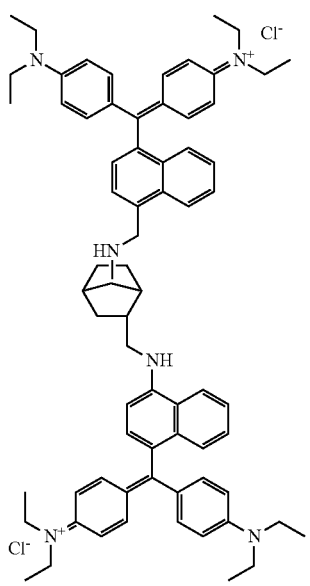

(Composition of Colored Compositions)
<Composition of Red Curable Resin Composition>
C.I. Pigment Red 177: 2 parts by mass
C.I. Pigment Red 254: 4 parts by mass
Polysulfonic acid-type polymer dispersant: 2 parts by mass
The above-described curable resin composition: 30 parts by mass (solid content 40%)
3-Methoxybutyl acetate: 80 parts by mass
<Composition of Green Curable Resin Composition>
C.I. Pigment Green 58: 5 parts by mass
C.I. Pigment Yellow 138: 1 parts by mass
Polysulfonic acid-type polymer dispersant: 2 parts by mass
The above-described curable resin composition: 30 parts by mass (solid content 40%)
3-Metboxybutyl acetate: 80 parts by mass
<Composition of Blue Curable Resin Composition>
The above-described blue colorant 1: 5 parts by mass
Polysulfonic acid-type polymer dispersant: 3 parts by mass
The above-described curable resin composition: 30 parts by mass (solid content 40%)
3-Methoxybutyl acetate: 80 parts by mass
(Formation of Protective Film)
Onto the substrate with the thus formed colored layer, a curable resin composition was spin-coated, followed by drying to form a dried coated film with a thickness of 2 μm. A photomask was disposed at a distance of 100 μm from the coated film of the curable resin composition, and the region where a colored layer is to be formed was irradiated with ultraviolet light from an ultra-high pressure mercury lamp of 2.0 kW for 10 seconds in a proximity aligner. Subsequently, the substrate was immersed in an aqueous solution of 0.05 mass % potassium hydroxide (liquid temperature: 23° C.) for 1 min for alkaline-development so as to remove only the uncured portion of the coated film of the curable resin composition. The substrate was thereafter left to stand at a temperature of 200° C. for 30 min so as to undergo heating treatment to form a protective film.

(Formation of Spacers)
Onto the substrate with the thus formed colored layer and a protective layer, a curable resin composition was spin-coated, followed by drying to form a coated film. A photomask was disposed at a distance of 100 μm from the coated film of the curable resin composition, and only the region for forming spacers was irradiated with ultraviolet light for 10 seconds from an ultra-high pressure mercury lamp of 2.0 kW in a proximity aligner. Subsequently, the substrate was immersed in an aqueous solution of 0.05 mass % potassium hydroxide (liquid temperature: 23° C.) for 1 min for alkaline-development to remove only the uncured portions of the coated film of the curable resin composition. The substrate was thereafter left to stand at a temperature of 200° C. for 30 min so as to undergo heating treatment to form a predetermined number density of fixed spacers each having an upper end area of 100 μm$^2$ and a height of 3.0 μm.

(Fabrication of Liquid Crystal Panel)
Onto the thus obtained color filter, an orientation membrane of polyimide was formed. Subsequently, a necessary amount of IPS (in-plane-switching) liquid crystals were added dropwise onto a glass substrate formed with TFTs (thin-film transistors), and the color filter was overlaid thereon. The glass substrate and the color filter were exposed to light at an irradiance level of 400 mJ/cm$^2$ and joined together using an UV curable resin as a sealing material at ambient temperature under a pressure of 0.3 kgf/cm$^2$, followed by cell formation to obtain a liquid crystal panel.

Figure 3:
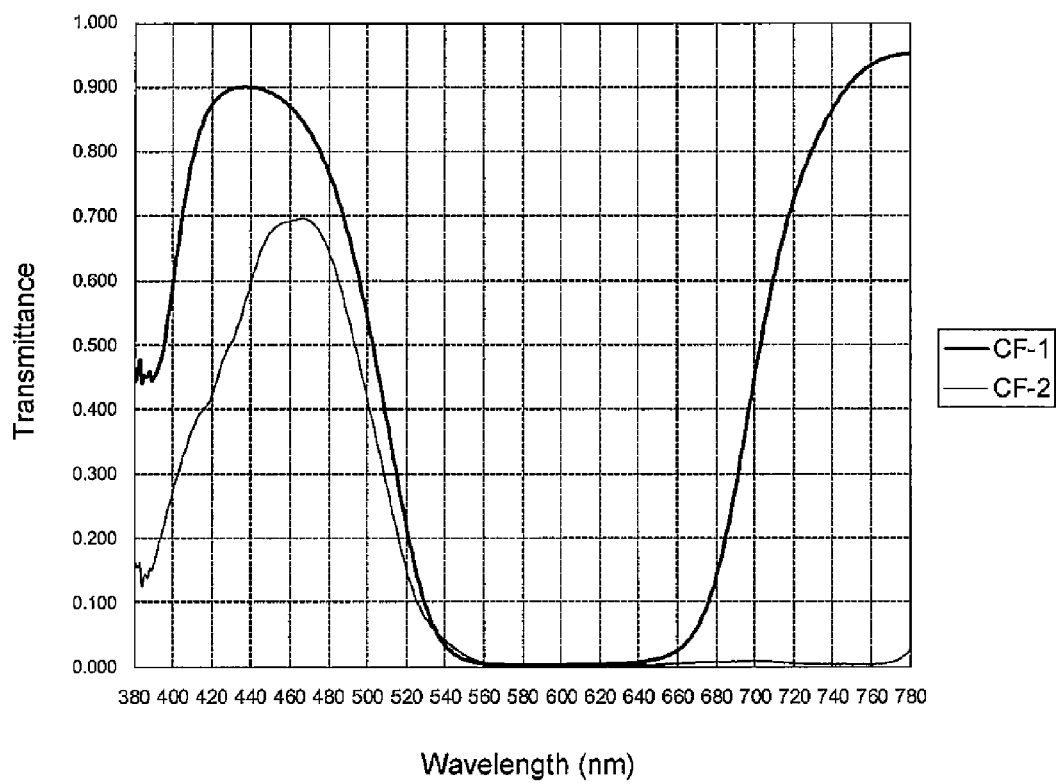
FIG. 3 showing a comparison of the transmission spectrum of the blue pixels of a color filter according to the present embodiment with the transmission spectrum of a comparative example.

The thicker line in FIG. 3 (CF-1) is a spectral transmittance curve of the blue pixel in Color Filter 1 of the present Example. The blue pixel in the color filter of the present Example had an average transmittance of 89.4% in the wavelength range of 440 nm to 455 nm of the spectral transmittance curve, an average transmittance of 89.1% in the wavelength range of 420 nm to 460 nm of the spectral transmittance curve, an average transmittance of 80.8% in the wavelength range of 400 nm to 500 nm, and a transmittance of 55.4% or more in the wavelength range of 720 nm to 780 nm of the spectral transmittance curve.

Furthermore, in the blue pixel of Color Filter 1, the difference between the maximum value and the minimum value in transmittance in the wavelength range of 440 nm to 455 nm of the spectral transmittance curve was 1.9%, and the difference between the maximum value and the minimum value in transmittance in the wavelength range of 420 nm to 460 nm was 3.3%.

An image display module 1 was fabricated using the thus obtained Light Emitting Device 1 and Color Filter 1.

Comparative Example 1

Color Filter 2 was fabricated in the same manner as Example 1 except that the blue curable resin composition was changed to the following.
<Composition of Blue Curable Resin Composition>
C.I. Pigment Blue 15:6:5 parts by mass
Polysulfonic acid-type polymer dispersant: 3 parts by mass
The above-described curable resin composition: 30 parts by mass (solid content 40%)
3-Methoxybutyl acetate: 80 parts by mass
The thinner line in FIG. 3 (CF-2) is a spectral transmittance curve of the blue pixel in Color Filter 2 of Comparative Example. The blue pixel of the resultant Color Filter 2 had an average transmittance of 65.4% in the wavelength range of 440 nm to 455 nm of the spectral transmittance curve, an average transmittance of 58.4% in the wavelength range of 420 nm to 460 nm of the spectral transmittance curve, and a transmittance of 54.9% in the wavelength range of 400 nm to 500 nm, and 2.5% or less in the wavelength range of 720 nm to 780 nm of the spectral transmittance curve.

Further, in the blue pixel of Color Filter 2 of Comparative Example, the difference between the maximum value and the minimum value in transmittance in the wavelength range of 440 nm to 455 nm of the spectral transmittance curve was 13.1%, and the difference between the maximum value and the minimum value in transmittance in the wavelength range of 420 nm to 460 nm of the spectral transmittance curve was 39.2%.

An image display module C1 was fabricated using the thus obtained Light Emitting Device 1 and Color Filter 2 (CF-2).

<Evaluation>

The thus obtained image display modules were evaluated as follows.

(Stability of White Point)

<Preparation Example of Image Display Modules for Evaluation>

In the preparation of Light Emitting Devices 1 of Example 1, light emitting elements each having an emission peak wavelength of 440 nm, 446 nm, and 455 nm are used, and light emitting devices that emit light having the chromaticity coordinates as shown in the Table below are prepared by appropriately adjusting the amounts of the fluoride fluorescent material and β sialon in Production Example 1.

The chromaticity coordinates of light emitted from the fabricated light emitting devices and passed through Color Filter 1 (CF-1) of Example 1 or Color Filter 2 (CF-2) of Comparative Example 1 are measured.

For the respective chromaticity coordinates of light that is emitted from the light emitting devices and passed through the respective color filters, the amount of change in chromaticity coordinates associated with changes in the emission peak wavelength of the light emitting elements were calculated, and the stability of white points were evaluated. The smaller the amount of change in chromaticity coordinates associated with changes in the emission peak wavelength of the light emitting elements, the greater the stability of the white point is considered to be.

TABLE 3

| | | Emission peak wavelength of light emitting element (nm) | | | | | | Amount of change in chromaticity coordinate | |
|---|---|---|---|---|---|---|---|---|---|
| | | 440 Chromaticity coordinate | | 446 Chromaticity coordinate | | 455 Chromaticity coordinate | | | |
| | | x | y | x | y | x | y | Δx | Δy |
| Light emitting device (0.2770, 0.2600) | After passing through CF-1 | 0.2808 | 0.2666 | 0.2806 | 0.2659 | 0.2802 | 0.2657 | 0.0006 | 0.0009 |
| | After passing through CF-2 | 0.2886 | 0.2827 | 0.2861 | 0.2752 | 0.2833 | 0.2673 | 0.0053 | 0.0154 |
| Light emitting device (0.2600, 0.2200) | After passing through CF-1 | 0.2637 | 0.2265 | 0.2636 | 0.226 | 0.2633 | 0.226 | 0.0004 | 0.0005 |
| | After passing through CF-2 | 0.2717 | 0.2424 | 0.2696 | 0.2354 | 0.2673 | 0.2282 | 0.0044 | 0.0142 |
| Light emitting device (0.2400, 0.2000) | After passing through CF-1 | 0.2427 | 0.2064 | 0.2427 | 0.2059 | 0.2424 | 0.206 | 0.0003 | 0.0005 |
| | After passing through CF-2 | 0.2471 | 0.2218 | 0.2456 | 0.2149 | 0.2443 | 0.2081 | 0.0028 | 0.0137 |
| Light emitting device (0.3000, 0.2000) | After passing through CF-1 | 0.307 | 0.2068 | 0.3067 | 0.2063 | 0.3062 | 0.2064 | 0.0008 | 0.0005 |
| | After passing through CF-2 | 0.3279 | 0.2226 | 0.324 | 0.2166 | 0.3196 | 0.2107 | 0.0083 | 0.0119 |
| Light emitting device (0.3000, 0.3000) | After passing through CF-1 | 0.304 | 0.3061 | 0.3038 | 0.3055 | 0.3034 | 0.3052 | 0.0006 | 0.0009 |
| | After passing through CF-2 | 0.3127 | 0.3215 | 0.31 | 0.3143 | 0.3069 | 0.3062 | 0.0058 | 0.0153 |
| Light emitting device (0.2400, 0.3000) | After passing through CF-1 | 0.2398 | 0.3068 | 0.2398 | 0.3061 | 0.2396 | 0.3058 | 0.0002 | 0.001 |
| | After passing through CF-2 | 0.2306 | 0.3261 | 0.2298 | 0.3172 | 0.2294 | 0.3075 | 0.0012 | 0.0186 |

Table 3 shows that the image display modules of the Examples are superior in the stability of white point, because even when the emission peak wavelength of a light source fluctuates, the fluctuation of the chromaticity coordinates of the displayed white point is small.

In contrast, in the image display modules according to Comparative Examples, when the emission peak wavelength of a light source fluctuates, the chromaticity coordinates of the displayed white point largely fluctuate, demonstrating poor stability of the displayed white points.

<Fabrication of Image Display Device>

An image display device was fabricated using the thus obtained image display module.

(Fabrication of Backlight Member)

A light emitting device described above, a mounting board for mounting the light emitting device, and a light-guiding panel were prepared.

An acrylic resin was molded into a plate to prepare a light-guiding panel. In the mounting board, a wiring pattern was formed on the surface of a glass epoxy resin by arranging a copper foil. The above-described light emitting device was solder-mounted on the mounting board. Subsequently, a backlight member was fabricated by disposing the light-extraction surface of the light emitting device to face the light incidence plane of the light-guiding panel.

(Fabrication of Image Display Device)

A diffusion sheet and a prism sheet were disposed between the liquid crystal panel and the backlight unit, and the image display devices were each fabricated including a driver IC (integrated circuit).

Image display devices including an image display module of the present embodiment demonstrated superior image display properties including the stability of the white point, high brightness, and color purity.

EXPLANATIONS OF LETTERS AND NUMERALS

4: color filter, 10: liquid crystal cell member, 20: backlight member, 21: light emitting device, 100: image display device,
210: light emitting element, 250: encapsulating member, 270: fluorescent material, 200: light emitting device The present invention is not limited to the specific embodiments described above. Those skilled in the art can appropriately change non-essential elements or substitute non-essential elements with other known elements in these embodiments within the technical idea disclosed in the present invention.

As described above, it should be obvious that various other embodiments are possible without departing the spirit and scope of the present invention. Accordingly, the scope and spirit of the present invention should be limited only by the following claims.

All publications, patent applications, and technical standards mentioned in this specification are herein incorporated by reference to the same extent as if each individual publication, patent application, or technical standard was specifically and individually indicated to be incorporated by reference.

What is claimed is:

1. An image display module, comprising:
a light emitting device that comprises:
a nitride semiconductor light-emitting element, as a light source, having an emission peak wavelength in a wavelength range of 380 nm to 485 nm;
an $Mn^{4+}$-activated red fluorescent material having a maximum excitation wavelength in the wavelength range, an emission peak wavelength of 610 nm to 670 nm, and a half bandwidth of the emission spectrum of 30 nm or less; and
a green fluorescent material having an emission peak wavelength in a wavelength range of 510 nm to 550 nm, and
a color filter that comprises:
a blue pixel, a red pixel, a green pixel, and a plurality of light shielding portions between the blue, red, and green pixels, wherein
a difference between a maximum and a minimum value of transmittance of the blue pixel in a wavelength range of 420 nm to 460 nm of a spectral transmittance curve is 4% or less; and
the blue pixel comprises a colorant represented by either formula (I) or formula (III):

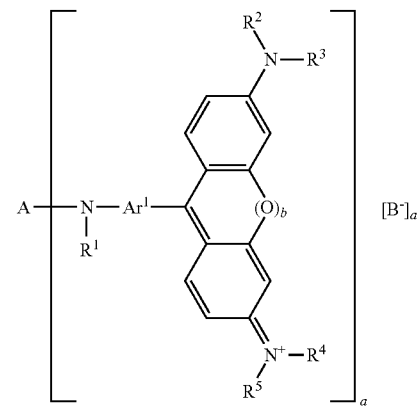

wherein in Formula (I):
A is an organic group of "a"-valence in which a carbon atom that is directly bonded with N has no π (pi) bond, and the organic group is an aliphatic hydrocarbon group having a saturated aliphatic hydrocarbon group at least at a terminal which is directly bonded to N, or an aromatic group having such an aliphatic hydrocarbon group, and the carbon chain includes O, S, or N;
$B^-$ denotes a monovalent anion;
$B^-$s each are the same or different;
$R^1$ to $R^5$ are each independently a hydrogen atom, an unsubstituted or substituted alkyl group, or an unsubstituted or substituted aryl group;
$R^2$ and $R^3$ as well as $R^4$ and $R^5$ are optionally bonded to each other to form a ring structure;
$Ar^1$ denotes an unsubstituted or substituted divalent aromatic group;
$R^1$s to $R^5$s and $Ar^1$s each are the same or different;
"a" denotes an integer of 2 to 4;
"b" is 0 or 1, and when "b" is 0, there is no bond; and
"b"s each are the same or different,

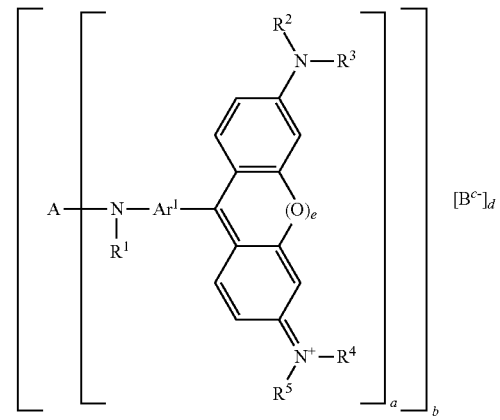

wherein in Formula (III):
A is an organic group of "a"-valence in which a carbon atom that is directly bonded with N has no π (pi) bond, and the organic group is an aliphatic hydrocarbon group having a saturated aliphatic hydrocarbon group at least at a terminal which is directly bonded to N, or an aromatic group having such an aliphatic hydrocarbon group, and the carbon chain includes O, S, or N;

$B^{c-}$ denotes a "c"-valent anion;

$R^1$ to $R^5$ are each independently a hydrogen atom, an unsubstituted or substituted alkyl group, or an unsubstituted or substituted aryl group;

$R^2$ and $R^3$ are optionally bonded to form a ring structure;

$R^4$ and $R^5$ are optionally bonded to form a ring structure;

$Ar^1$ denotes an unsubstituted or substituted divalent aromatic group;

$R^1$s each are the same or different;

$R^2$s each are the same or different;

$R^3$s each are the same or different;

$R^4$s each are the same or different;

$R^5$s each are the same or different;

$Ar^1$s each are the same or different;

"a" denotes an integer of 2 to 4;

"c" denotes an integer of 2 or more;

"b" and "d" each are an integer of 1 or more;

"e" is 0 or 1, and when e is 0, there is no bond; and

"e"s each are the same or different.

2. The image display module according to claim 1, wherein
the difference between the maximum value and the minimum value of the transmittance of the blue pixel in a wavelength range of 440 nm to 455 nm of the spectral transmittance curve is 2% or less.

3. The image display module according to claim 1, wherein
an average transmittance of the blue pixel is 80% or more in a wavelength range of 400 nm to 500 nm of the spectral transmittance curve.

4. The image display module according to claim 1, wherein
the average transmittance of the blue pixel is 89% or more in the wavelength range of 420 nm to 460 nm of the spectral transmittance curve.

5. The image display module according to claim 1, wherein
the average transmittance of the blue pixel is 50% or more in a wavelength range of 720 nm to 780 nm of the spectral transmittance curve.

6. The image display module according to a claim 1, wherein
an integral over a wavelength range of 650 nm and above of a transmitted light spectrum of light emitted from the light emitting device and passed through the blue pixel is 0.1 or less.

7. The image display module according to claim 1, wherein
the red fluorescent material comprises at least one compound selected from the group consisting of an $Mn^{4+}$-activated Mg fluorogermanate fluorescent material ($3.5MgO.0.5MgF_2.GeO_2:Mn^{4+}$), a fluoride fluorescent material represented by $M^1{}_2M^2F_6:Mn^{4+}$ ($M^1=Li^+$, $Na^+$, $K^+$, $Rb^+$, $Cs^+$, $NH_4^+$; $M^2=Si$, Ge, Sn, Ti, Zr), a nanocrystal, and a quantum dot.

8. The image display module according to claim 1, wherein the green fluorescent material includes at least one compound selected from the group consisting of: an Eu-activated halosilicate fluorescent material represented by $M^{11}{}_8MgSi_4O_{16}X^{11}:Eu$ ($M^{11}=Ca$, Sr, Ba, Zn; $X^{11}=F$, Cl, Br, I), an Eu-activated silicate fluorescent material represented by $M^{12}{}_2SiO_4:Eu$ ($M^{12}=Mg$, Ca, Sr, Ba, Zn), an Eu-activated β sialon fluorescent material represented by $Si_{6-z}Al_zO_zN_{8-z}:Eu$ ($0<z\leq4.2$), an Eu-activated thiogallate fluorescent material represented by $M^{13}Ga_2S_4:Eu$ ($M^{13}=Mg$, Ca, Sr, Ba), a rare-earth aluminate fluorescent material represented by $(Y,Gd,Lu,Tb)_3(Al,Ga)_5O_{12}:Ce$, a lanthanum silicon nitride-based fluorescent material represented by $La_3Si_6N_{11}:Ce$, a nanocrystal, and a quantum dot.

9. The image display module according to claim 1, wherein
the red fluorescent material is a fluoride fluorescent material represented by $M^1{}_2M^2F_6:Mn^{4+}$ ($M^1=Li^+$, $Na^+$, $K^+$, $Rb^+$, $Cs^+$, $NH_4^+$; $M^2=Si$, Ge, Sn, Ti, Zr), and the green fluorescent material is an Eu-activated β sialon fluorescent material represented by the $Si_{6-z}Al_zO_zN_{8-z}:Eu$ ($0<z\leq4.2$).

10. An image display device comprising the image display module according to claim 1.

11. The image display device according to claim 10, wherein when the emission peak wavelength of the light source changes in a range of 440 nm to 455 nm, amounts of change, Δx and Δy, in white point within a region surrounded by four points with coordinates (x, y): (0.2400, 0.2000), (0.2400, 0.3000), (0.3000, 0.3000), and (0.3000, 0.2000), are both 0.001 or less.

12. An image display module, comprising:
a light emitting device that comprises:
a nitride semiconductor light-emitting element, as a light source, having an emission peak wavelength in a wavelength range of 380 nm to 485 nm,
an $Mn^{4+}$-activated red fluorescent material having a maximum excitation wavelength in the wavelength range, an emission peak wavelength of 610 nm to 670 nm, and a half bandwidth of the emission spectrum of 30 nm or less, and
a green fluorescent material having an emission peak wavelength in a wavelength range of 510 nm to 550 nm; and
a color filter that comprises:
a blue pixel, a red pixel, a green pixel, and a plurality of light shielding portions between the blue, red, and green pixels, wherein
a difference between a maximum and a minimum value of transmittance of the blue pixel in a wavelength range of 420 nm to 460 nm of a spectral transmittance curve is 4% or less, and
the red fluorescent material comprises at least one compound selected from the group consisting of an $Mn^{4+}$-activated Mg fluorogermanate fluorescent material ($3.5MgO.0.5MgF_2.GeO_2:Mn^{4+}$), a fluoride fluorescent material represented by $M^1{}_2M^2F_6:Mn^{4+}$ ($M^1=Li^+$, $Na^+$, $Rb^+$, $Cs^+$, $NH_4^+$; $M^2=Si$, Ge, Sn, Ti, Zr), a nanocrystal, and a quantum dot.

13. The image display module according to claim 12, wherein
the green fluorescent material includes at least one compound selected from the group consisting of: an Eu-activated halosilicate fluorescent material represented by $M^{11}{}_8MgSi_4O_{16}X^{11}:Eu$ ($M^{11}=Ca$, Sr, Ba, Zn; $X^{11}=F$, Cl, Br, I), an Eu-activated silicate fluorescent material represented by $M^{12}{}_2SiO_4:Eu$ ($M^{12}=Mg$, Ca, Sr, Ba, Zn), an Eu-activated β sialon fluorescent material represented by the $Si_{6-z}Al_zO_zN_{8-z}:Eu$ ($0<z\leq4.2$), an Eu-activated thiogallate fluorescent material represented by $M^{13}Ga_2S_4:Eu$ ($M^{13}=Mg$, Ca, Sr, Ba), a rare-earth aluminate fluorescent material represented by $(Y,Gd,Lu,Tb)_3(Al,Ga)_5O_{12}:Ce$, a lanthanum silicon nitride-based fluorescent material represented by $La_3Si_6N_{11}:Ce$, a nanocrystal, and a quantum dot.

14. An image display device comprising the image display module according to claim 12.

15. The image display device according to claim 14, wherein when the emission peak wavelength of the light source changes in a range of 440 nm to 455 nm, amounts of change, Δx and Δy, in white point within a region surrounded by four points with coordinates (x, y): (0.2400, 0.2000), (0.2400, 0.3000), (0.3000, 0.3000), and (0.3000, 0.2000), are both 0.001 or less.

16. An image display module, comprising:
a light emitting device that comprises:
a nitride semiconductor light-emitting element, as a light source, having an emission peak wavelength in a wavelength range of 380 nm to 485 nm,
an $Mn^{4+}$-activated red fluorescent material having a maximum excitation wavelength in the wavelength range, an emission peak wavelength of 610 nm to 670 nm, and a half bandwidth of the emission spectrum of 30 nm or less, and
a green fluorescent material having an emission peak wavelength in a wavelength range of 510 nm to 550 nm; and
a color filter that comprises:
a blue pixel, a red pixel, a green pixel, and a plurality of light shielding portions between the blue, red, and green pixels, wherein
a difference between a maximum and a minimum value of transmittance of the blue pixel in a wavelength range of 420 nm to 460 nm of a spectral transmittance curve is 4% or less, and
the red fluorescent material comprises at least one compound selected from the group consisting of an $Mn^{4+}$-activated Mg fluorogermanate fluorescent material ($3.5MgO \cdot 0.5MgF_2 \cdot GeO_2:Mn^{4+}$), a fluoride fluorescent material represented by $M^1{}_2M^2F_6:Mn^{4+}$ ($M^1=Li^+$, $Na^+$, $K^+$, $Rb^+$, $Cs^+$, $NH_4{}^+$; $M^2=Ge$, Sn, Zr), a nanocrystal, and a quantum dot.

17. The image display module according to claim 16, wherein
the green fluorescent material includes at least one compound selected from the group consisting of: an Eu-activated halosilicate fluorescent material represented by $M^{11}{}_8MgSi_4O_{16}X^{11}:Eu$ ($M^{11}=Ca$, Sr, Ba, Zn; $X^{11}=F$, Cl, Br, I), an Eu-activated silicate fluorescent material represented by $M^{12}{}_2SiO_4:Eu$ ($M^{12}=Mg$, Ca, Sr, Ba, Zn), an Eu-activated β sialon fluorescent material represented by the $Si_{6-z}Al_zO_zN_{8-z}:Eu$ ($0<z\leq4.2$), an Eu-activated thiogallate fluorescent material represented by $M^{13}Ga_2S_4:Eu$ ($M^{13}=Mg$, Ca, Sr, Ba), a rare-earth aluminate fluorescent material represented by $(Y,Gd,Lu,Tb)_3(Al,Ga)_5O_{12}:Ce$, a lanthanum silicon nitride-based fluorescent material represented by $La_3Si_6N_{11}:Ce$, a nanocrystal, and a quantum dot.

18. An image display device comprising the image display module according to claim 16.

19. The image display device according to claim 18, wherein when the emission peak wavelength of the light source changes in a range of 440 nm to 455 nm, amounts of change, Δx and Δy, in white point within a region surrounded by four points with coordinates (x, y): (0.2400, 0.2000), (0.2400, 0.3000), (0.3000, 0.3000), and (0.3000, 0.2000), are both 0.001 or less.

* * * * *